(12) United States Patent
Inoue et al.

(10) Patent No.: US 11,728,390 B2
(45) Date of Patent: Aug. 15, 2023

(54) OXIDE SEMICONDUCTOR FILM, THIN FILM TRANSISTOR, OXIDE SINTERED BODY, AND SPUTTERING TARGET

(71) Applicant: IDEMITSU KOSAN CO., LTD., Tokyo (JP)

(72) Inventors: Kazuyoshi Inoue, Sodegaura (JP); Masatoshi Shibata, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 880 days.

(21) Appl. No.: 16/482,203

(22) PCT Filed: Jan. 23, 2018

(86) PCT No.: PCT/JP2018/001929
§ 371 (c)(1),
(2) Date: Jul. 30, 2019

(87) PCT Pub. No.: WO2018/143005
PCT Pub. Date: Aug. 9, 2018

(65) Prior Publication Data
US 2019/0348505 A1    Nov. 14, 2019

(30) Foreign Application Priority Data
Feb. 1, 2017  (JP) ................... 2017-016853

(51) Int. Cl.
*H01L 29/24* (2006.01)
*C04B 35/01* (2006.01)
(Continued)

(52) U.S. Cl.
CPC .............. *H01L 29/24* (2013.01); *C04B 35/01* (2013.01); *C04B 35/64* (2013.01); *C23C 14/086* (2013.01);
(Continued)

(58) Field of Classification Search
None
See application file for complete search history.

(56) References Cited

U.S. PATENT DOCUMENTS

2007/0071985 A1* 3/2007 Kumar ............... C04B 35/495
                                                           428/432
2010/0129660 A1   5/2010 Nakayama et al.
(Continued)

FOREIGN PATENT DOCUMENTS

CN    104136655 A   11/2014
JP    H04-272612 A   9/1992
(Continued)

OTHER PUBLICATIONS

International Searching Authority, "International Search Report," issued in connection with International Patent Application No. PCT/JP2018/001929, dated Mar. 27, 2018.
(Continued)

*Primary Examiner* — Jason Berman
(74) *Attorney, Agent, or Firm* — Foley & Lardner LLP

(57) ABSTRACT

An oxide semiconductor film contains In, Ga, and Sn at respective atomic ratios satisfying formulae (1) to (3): $0.01 \leq Ga/(In+Ga+Sn) \leq 0.30$ ... (1); $0.01 \leq Sn/(In+Ga+Sn) \leq 0.40$ ... (2); and $0.55 \leq In/(In+Ga+Sn) \leq 0.98$ ... (3), and Al at an atomic ratio satisfying a formula (4): $0.05 \leq Al/(In+Ga+Sn+Al) \leq 0.30$ ... (4).

16 Claims, 16 Drawing Sheets

(51) Int. Cl.
| | |
|---|---|
| C04B 35/64 | (2006.01) |
| C23C 14/08 | (2006.01) |
| C23C 14/34 | (2006.01) |
| H01L 29/66 | (2006.01) |
| H01L 29/786 | (2006.01) |
| H01L 29/26 | (2006.01) |

(52) U.S. Cl.
CPC .......... *C23C 14/3414* (2013.01); *H01L 29/26* (2013.01); *H01L 29/66969* (2013.01); *H01L 29/66977* (2013.01); *H01L 29/78693* (2013.01); *C04B 2235/3217* (2013.01); *C04B 2235/3286* (2013.01); *C04B 2235/3293* (2013.01); *C04B 2235/602* (2013.01); *H01L 29/263* (2013.01)

(56) References Cited

U.S. PATENT DOCUMENTS

| | | |
|---|---|---|
| 2011/0102722 A1 | 5/2011 | Kang et al. |
| 2011/0168994 A1 | 7/2011 | Kawashima et al. |
| 2013/0202850 A1 | 8/2013 | Nakayama et al. |
| 2013/0285053 A1 | 10/2013 | Kawashima et al. |
| 2013/0320336 A1 | 12/2013 | Ha et al. |
| 2015/0010727 A1 | 1/2015 | Saito et al. |
| 2015/0311345 A1* | 10/2015 | Zhao ............... H01L 29/66969 257/43 |

FOREIGN PATENT DOCUMENTS

| | | |
|---|---|---|
| JP | 2011-094232 A | 5/2011 |
| JP | 2011-174134 A | 9/2011 |
| JP | 2013-070010 A | 4/2013 |
| JP | 2013-249537 A | 12/2013 |
| JP | 2015-166305 A | 9/2015 |
| TW | 200909380 A | 3/2009 |
| TW | 201011115 A | 3/2010 |
| TW | 201546018 A | 12/2015 |
| WO | WO-03/014409 A1 | 2/2003 |
| WO | WO-2009/128424 A1 | 10/2009 |
| WO | WO-2015/108110 A1 | 7/2015 |

OTHER PUBLICATIONS

International Searching Authority, "Written Opinion," issued in connection with International Patent Application No. PCT/JP2018/001929, dated Mar. 27, 2018.
Office Action dated Jul. 23, 2021 issued in a corresponding Taiwanese Patent Application No. 107103590, (5 pages).
International Preliminary report on Patentability dated Aug. 6, 2019 for corresponding Application No. PCT/JP2018/001929 (5 pages).

* cited by examiner

OXIDE SEMICONDUCTOR FILM, THIN FILM TRANSISTOR, OXIDE SINTERED BODY, AND SPUTTERING TARGET

RELATED APPLICATIONS

The present application claims priority under 37 U.S.C. § 371 to International Patent Application No. PCT/JP2018/001929, filed Jan. 23, 2018, which claims priority to and the benefit of Japanese Patent Application No. 2017-016853, filed on Feb. 1, 2017. The contents of these applications are hereby incorporated by reference in their entireties.

TECHNICAL FIELD

The present invention relates to an oxide semiconductor film, a sputtering target capable of being used for production of an oxide semiconductor film of a TFT (Thin-Film Transistor) and the like, and a sintered oxide as a material of the sputtering target.

BACKGROUND ART

Amorphous oxide semiconductor usable for a thin-film transistor has higher carrier mobility than general-purpose amorphous silicon (a-Si) and a large optical band gap, and can form a film at a low temperature. Accordingly, the use of the amorphous oxide semiconductor is expected in the field of next-generation display devices requiring high-resolution and high-speed large-size image display, and a resin substrate with low heat resistance.

The oxide semiconductor (film) is suitably formed through a sputtering process, in which a sputtering target is sputtered. This is because a thin film formed through the sputtering process is more excellent in terms of in-plane uniformity (e.g. composition uniformity in a film plane direction (i.e. within a film plane) and even film thickness) than a thin film formed through ion-plating process, vacuum deposition process or electron beam deposition process, allowing the formation of the thin film with the same composition as that of the sputtering target.

Patent Literature 1 discloses an example of an oxide semiconductor film formed of $In_2O_3$ added with $Ga_2O_3$ and $SnO_2$. However, the control of carriers (i.e. reduction in carrier concentration) of this film after film formation is so difficult that the film sometimes does not serve as a semiconductor after an interlayer insulating film or the like is formed on the film by CVD or the like.

Patent Literature 2 discloses a transistor laminated with an oxide semiconductor film formed of $In_2O_3$ added with $Ga_2O_3$ and $SnO_2$ and an oxide semiconductor film formed of $In_2O_3$ added with $Ga_2O_3$, $SnO_2$, and ZnO, and a sputtering target.

Patent Literatures 3 to 6 each disclose a method of producing a transparent conductive film formed of $In_2O_3$, $Ga_2O_3$, and $SnO_2$, and an example of a sputtering target.

CITATION LIST

Patent Literature(s)

| Patent Literature 1 | JP 2013-249537 A |
| Patent Literature 2 | WO 2015-108110 |
| Patent Literature 3 | JP 2011-94232 A |
| Patent Literature 4 | JP 4-272612 A |
| Patent Literature 5 | WO 2003-014409 |
| Patent Literature 6 | WO 2009-128424 |

SUMMARY OF THE INVENTION

Problem(s) to be Solved by the Invention

Meanwhile, there exists a strong demand for higher-quality TFT, and for a material exhibiting high carrier mobility and small change in properties during CVD process and the like. Minute line-shaped cracks called hairline cracks are sometimes caused at the time of sputtering on a typical sputtering target made of a sintered oxide produced by sintering $In_2O_3$, $Ga_2O_3$, and $SnO_2$. Accordingly, there also exists a demand for a sputtering target not easily causing cracks.

An object of the invention is to provide a new oxide semiconductor film made of a new oxide system.

Another object of the invention is to provide an oxide semiconductor film exhibiting excellent performance when being used for a TFT (Thin-Film Transistor), a sputtering target capable of forming the oxide semiconductor film, and a sintered oxide as a material of the sputtering target.

Means for Solving the Problem(s)

According to some aspects of the invention, an oxide semiconductor film, a thin-film transistor, a sintered oxide, and a sputtering target as described below are provided.

[1] An oxide semiconductor film containing In, Ga and Sn at respective atomic ratios satisfying formulae (1) to (3) below, $$0.01 \leq Ga/(In+Ga+Sn) \leq 0.30 \quad (1),$$

$$0.01 \leq Sn/(In+Ga+Sn) \leq 0.40 \quad (2), \text{ and}$$

$$0.55 \leq In/(In+Ga+Sn) \leq 0.98 \quad (3), \text{ and}$$

Al at an atomic ratio satisfying a formula (4) below, $$0.05 \leq Al/(In+Ga+Sn+Al) \leq 0.30 \quad (4).$$

[2] A thin-film transistor including the oxide semiconductor film according to [1].

[3] A sintered oxide including In, Ga and Sn at respective atomic ratios satisfying formulae (5) to (7) below, $$0.01 \leq Ga/(In+Ga+Sn) \leq 0.30 \quad (5),$$

$$0.01 \leq Sn/(In+Ga+Sn) \leq 0.40 \quad (6), \text{ and}$$

$$0.55 \leq In/(In+Ga+Sn) \leq 0.98 \quad (7), \text{ and}$$

Al at an atomic ratio satisfying a formula (8) below, $$0.05 \leq Al/(In+Ga+Sn+Al) \leq 0.30 \quad (8).$$

[4] The sintered oxide according to [3], where the sintered oxide includes a main component in a form of $In_2O_3$ crystals, and one or both of $InGaO_3$ crystals and $SnO_2$ crystals.

[5] The sintered oxide according to [3] or [4], where the sintered oxide does not to contain one or both of $Ga_3InSn_5O_{16}$ compound and $Ga_2In_6Sn_2O_{16}$ compound as a main component.

[6] The sintered oxide according to any one of [3] to [5], where a relative density of the sintered oxide is 95% or more.

[7] The sintered oxide according to any one of [3] to [6], where a bulk resistivity of the sintered oxide is 20 mΩcm or less.

[8] A sputtering target including: the sintered oxide according to any one of [3] to [7]; and a backing plate.

[9] A production method of the sintered oxide according to any one of [3] to [6], the method including:
mixing material compound powders including In, Ga, and Sn to prepare a mixture;
molding the mixture to prepare a molding body; and
sintering the molding body.

[10] An electronic device including the thin-film transistor according to [2].

The above aspect of the invention provides a new oxide semiconductor film made of a new oxide system.

Further, the above aspects of the invention provide an oxide semiconductor film exhibiting excellent performance when being used for a TFT, a sputtering target capable of forming the oxide semiconductor film, and a sintered oxide as a material of the sputtering target.

BRIEF DESCRIPTION OF DRAWING(S)

DESCRIPTION OF EMBODIMENT(S)

BACKGROUND OF THE INVENTION

Figure 1A:
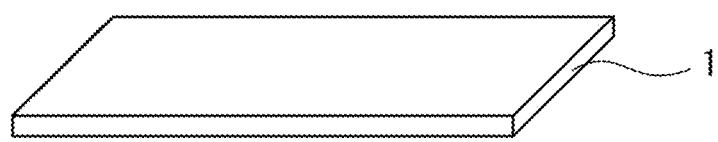
FIG. 1A is a perspective view showing a shape of a target according to an exemplary embodiment of the invention.

A background of the invention will be briefly described below.

Minute line-shaped cracks called hairline cracks are sometimes caused at the time of sputtering on a typical sputtering target made of a sintered oxide produced by sintering indium oxide ($In_2O_3$), gallium oxide ($Ga_2O_3$), and tin oxide ($SnO_2$). The hairline cracks may cause abnormal electrical discharge at the time of sputtering to generate a foreign body (so-called nodule), resulting in reduction in yield rate and deterioration in performance of a product.

Though the cause of the hairline cracks is not clearly known, it is speculated that the hairline cracks occur due to internal stress by a difference in thermal expansion coefficients, which is caused when heat is applied to the sputtering target in one direction at the time of sputtering or the like, between crystalline phases of the compounds such as $Ga_3In_5Sn_2O_{16}$, $Ga_2In_6Sn_2O_{16}$, and $Ga_3InSn_5O_{16}$ present in the sputtering target.

In order to solve the above problems, a sintering aid in a form of aluminum oxide ($Al_2O_3$) is added to indium oxide ($In_2O_3$), gallium oxide ($Ga_2O_3$), and tin oxide ($SnO_2$) for sintering, thereby inhibiting generation of compounds such as $Ga_3In_5Sn_2O_{16}$, $Ga_2In_6Sn_2O_{16}$, and $Ga_3InSn_5O_{16}$.

It is found that the sputtering target of the above composition is free from internal stress, causes no hairline cracks and the like, and can produce an oxide semiconductor with a stable composition (i.e. does not turn into a conductor even after a heat treatment and the like for production of TFT).

The background of the invention has been described as the above.

Structure of Sintered Oxide

Next, a structure of a sintered oxide according to an exemplary embodiment of the invention will be described below.

A sintered oxide according to an exemplary embodiment of the invention (sometimes simply referred to as the present sintered body hereinafter) contains In, Ga, and Sn at atomic ratios, as represented by the following formulae (5) to (7):

$$0.01 \leq Ga/(In+Ga+Sn) \leq 0.30 \quad (5),$$

$$0.01 \leq Sn/(In+Ga+Sn) \leq 0.40 \quad (6), \text{ and}$$

$$0.55 \leq In/(In+Ga+Sn) \leq 0.98 \quad (7), \text{ and}$$

and Al at an atomic ratio satisfying the following formula (8), $$0.05 \leq Al/(In+Ga+Sn+Al) \leq 0.30 \quad (8).$$

The present sintered body is produced by sintering a base material including indium oxide, gallium oxide, and tin oxide added with a sintering aid of aluminum oxide.

Specifically, $In_2O_3$, $Ga_2O_3$, and $SnO_2$ are mixed so that atomic ratios of In, Ga, and Sn are within the ranges represented by the following formulae (5) to (7):

$$0.01 \leq Ga/(In+Ga+Sn) \leq 0.30 \quad (5).$$

$$0.01 \leq Sn/(In+Ga+Sn) \leq 0.40 \quad (6), \text{ and}$$

$$0.55 \leq In/(In+Ga+Sn) \leq 0.98 \quad (7), \text{ and}$$

and $Al_2O_3$ (sintering aid) is added and mixed so that an atomic ratio of Al is within the range represented by the following formula (8):

$$0.05 \leq Al/(In+Ga+Sn+Al) \leq 0.30 \quad (8)$$

to prepare a material for sintering.

The sintering aid ($Al_2O_3$) added before $In_2O_3$, $Ga_2O_3$, and $SnO_2$ are sintered allows a formation of a sintered body, whose main component is not a $Ga_3InSn_5O_{16}$ compound or a $Ga_2In_6Sn_2O_{16}$ compound (i.e. typical main component in sintering $In_2O_3$, $Ga_2O_3$, and $SnO_2$) and which contains $In_2O_3$ crystals, $InGaO_3$ crystals and/or $SnO_2$ crystals.

Inevitable impurities may be contained in the sintered body. It should be noted that the inevitable impurities means an element(s) that is not intentionally added but is mixed in a material or during a production process. The same applies to the description below. Examples of the inevitable impurities include alkali metal and alkaline earth metal (Li, Na, K, Rb, Mg, Ca, Sr, Ba and the like). The content of the inevitable impurities is 10 ppm or less, preferably 1 ppm or less, further preferably 100 ppb or less. The concentration of impurities can be measured using ICP or SIMS. Hydrogen, nitrogen and/or halogen atom may be contained in addition to the alkali metal and alkaline earth metal. In this case, the concentration by SIMS measurement is 5 ppm or less, preferably 1 ppm or less, more preferably 100 ppb or less.

A sputtering target according to an aspect of the invention (sometimes referred to as the present target hereinafter) includes the above sintered oxide, and a backing plate.

The present sintered body is ground and polished into a plate to prepare a sputtering target material, which is bonded to a metallic backing plate using a low-melting-point metal (e.g. indium) to provide the sputtering target as a component of a sputtering apparatus.

The sintered body in the sputtering target including the present sintered body and the backing plate will be referred to as "the present target material" hereinafter.

The present sintered body (target material), which is produced by adding the sintering aid in a form of $Al_2O_3$ at a predetermined ratio before being sintered, reduces the formation of compounds such as $Ga_3In_5Sn_2O_{16}$, $Ga_2In_6Sn_2O_{16}$, and $Ga_3InSn_5O_{16}$. These compounds are believed to cause an internal stress at the time of sputtering to produce hairline cracks.

With the use of the present target material, the hairline cracks at the time of sputtering and consequent abnormal electrical discharge, which is a cause of a foreign body called nodule, can be prevented.

Though it is preferable for the present sintered body (target material) not to contain $Ga_3InSn_5O_{16}$ compound and $Ga_2In_6Sn_2O_{16}$ compound, these compounds may be present as long as these compounds in total do not account for the main component of the sintered body (i.e. the content of these compounds in total is 50 mass % or less).

The sintered body according to an exemplary embodiment of the invention does not contain one or both of $Ga_3InSn_5O_{16}$ compound and $Ga_2In_6Sn_2O_{16}$ compound as a main component. Without these compounds, a sintered body (target material) free of hairline cracks at the time of sputtering can be obtained.

The sintered body according to an exemplary embodiment of the invention contains a main component in a form of $In_2O_3$ crystals and one or both of $InGaO_3$ and $SnO_2$ crystals.

Herein, the phrase "main component in a form of $In_2O_3$ crystal" means that the $In_2O_3$ crystal accounts for more than 50 mass %, more preferably 55 mass % or more, further preferably 60 mass % or more of all the oxides in the sintered body.

Hereinafter, the term "main component" refers to a component in a sintered body that accounts for more than 50 mass % of all the oxides in the sintered body.

The main component in a form of $In_2O_3$ crystals and additional component of $InGaO_3$ crystals and/or $SnO_2$ crystals can provide a sintered body that is free of $Ga_3InSn_5O_{16}$ compound and/or $Ga_2In_6Sn_2O_{16}$ compound, which are main component(s) in a sintered body without being added with $Al_2O_3$. Thus, hairline cracks and the like are not likely to be caused at the time of sputtering with the use of the present target material.

In the sintered body according to another exemplary embodiment, it is preferable for a mass ratio of $In_2O_3$ and $InGaO_3$ measured in accordance with X-ray analysis is $In_2O_3 > InGaO_3$. When the content of $In_2O_3$ becomes larger than the content of $InGaO_3$, bulk resistivity of the sintered body (target material) is lowered, so that abnormal electrical discharge and/or arc discharge is not likely to occur at the time of sputtering. Thus, reduction in yield rate and deterioration in the performance of TFT can be prevented during the production process of TFT.

Gallium oxide is effective in reducing occurrence of oxygen vacancy and increasing a band gap in a resultant oxide semiconductor film. A Ga ratio [Ga/(In+Ga+Sn) (atomic ratio)] is preferably $0.01 \leq Ga/(In+Ga+Sn) \leq 0.30$. When the Ga ratio is less than 0.01, the oxygen vacancy is hardly reduced, thereby possibly failing to form the semiconductor film. When the Ga ratio is more than 0.30, the resultant film may become an insulation film due to elimination of the oxygen vacancy. More preferably, $0.02 \leq Ga/(In+Ga+Sn) \leq 0.27$, further preferably, $0.03 \leq Ga/(In+Ga+Sn) \leq 0.23$.

Tin oxide is chemically resistant and, as can be understood as a usage in an electro-conductive film, is believed to hardly affect carrier mobility in the semiconductor film. Accordingly, the Sn ratio [Sn/(In+Ga+Sn) (atomic ratio)] is preferably $0.01 \leq Sn/(In+Ga+Sn) \leq 0.40$. When the Sn ratio is less than 0.01, the chemical resistance may not be exhibited. When the Sn ratio is more than 0.40, the chemical resistance may be too high to etch the resultant semiconductor film to form an island(s) of the semiconductor film. More preferably, $0.02 \leq Sn/(In+Ga+Sn) \leq 0.35$, further preferably, $0.03 \leq Sn/(In+Ga+Sn) \leq 0.30$.

Indium oxide ensures the carrier mobility in the semiconductor film. The In ratio [In/(In+Ga+Sn) (atomic ratio)] is preferably 0.55≤In/(In+Ga+Sn)≤0.98. When the In ratio is less than 0.55, the carrier mobility may be lowered. The In ratio of more than 0.98 may cause crystallization or too much oxygen vacancy to form a semiconductor film (i.e. the resultant film may become a conductor). More preferably, 0.60≤In/(In+Ga+Sn)≤0.96, further preferably, 0.60≤In/(In+Ga+Sn)≤0.94.

Without the aluminum oxide in the base material, the main component of the crystalline phase in the resultant sintered body would be $Ga_3InSn_5O_{16}$ compound or $Ga_2In_6Sn_2O_{16}$ compound. By the addition of the aluminum oxide, a sintered body (target material) whose main component is $In_2O_3$ crystals, $InGaO_3$ crystals, and/or $Sn_2O_2$ crystals can be produced. Thus, the problem (i.e. the hairline cracks and the like) can be solved.

It is preferable that aluminum oxide is added in a content (atomic ratio) so that Al ratio satisfies the following formula (8), $$0.05 \leq Al/(In+Ga+Sn+Al) \leq 0.30 \quad (8).$$

When the ratio is less than 0.05, the generation of the $Ga_3InSn_5O_{16}$ compound and/or $Ga_2In_6Sn_2O_{16}$ compound may not be sufficiently reduced. When the ratio is more than 0.30, the carrier mobility in the thin-film transistor using the resultant oxide semiconductor film may be too low to be practical for use. The use of the oxide semiconductor film added with the aluminum oxide improves CVD resistance of the thin-film transistor. More preferably, 0.05≤Al/(In+Ga+Sn+Al)≤0.25, further preferably, 0.08≤Al/(In+Ga+Sn+Al)≤0.22.

The sintered body (target material) according to an exemplary embodiment of the invention more preferably contains In, Ga and Sn at atomic ratios satisfying the following formulae (5A) to (7A):

$$0.02 \leq Ga/(In+Ga+Sn) \leq 0.27 \quad (5A);$$

$$0.02 \leq Sn/(In+Ga+Sn) \leq 0.35 \quad (6A); \text{ and}$$

$$0.60 \leq In/(In+Ga+Sn) \leq 0.96 \quad (7A),$$

and Al at an atomic ratio satisfying the following formula (8A), $$0.05 \leq Al/(In+Ga+Sn+Al) \leq 0.25 \quad (8A).$$

The sintered body (target material) according to an exemplary embodiment of the invention more preferably contains In, Ga and Sn at atomic ratios satisfying the following formulae (5B) to (7B):

$$0.03 \leq Ga/(In+Ga+Sn) \leq 0.23 \quad (5B);$$

$$0.03 \leq Sn/(In+Ga+Sn) \leq 0.30 \quad (6B); \text{ and}$$

$$0.60 \leq In/(In+Ga+Sn) \leq 0.94 \quad (7B),$$

and Al at an atomic ratio satisfying the following formula (8B), $$0.08 \leq Al/(In+Ga+Sn+Al) \leq 0.22 \quad (8B).$$

A relative density of the sintered body (target material) according to an exemplary embodiment of the invention is preferably 95% or more.

When the relative density of the sintered body (target material) is 95% or more, the hairline cracks or nodules are not likely to be caused at the time of sputtering, thereby preventing deterioration in the performance and reduction in the yield rate of the thin-film transistor using the resultant oxide semiconductor film. In addition, the high relative density of the sintered body increases the density of the resultant film, so that a film-formation temperature in a CVD apparatus is not necessary to be lowered in forming a protective insulation film and/or interlayer insulating film on the film using the CVD apparatus, thereby providing a highly durable film. The relative density of the sintered body (target material) is preferably 97% or more, more preferably 98%, further preferably 99% or more.

The relative density is measurable according to the method described in Examples.

Bulk resistivity of the sintered body according to an exemplary embodiment of the invention is preferably 20 mΩcm or less. When the bulk resistivity is 20 mΩcm or less, occurrence of abnormal electrical discharge, discoloration in eroded parts, and/or occurrence of nodules can be prevented even at a high-power sputtering, thereby stabilizing the sputtering process. The bulk resistivity is more preferably 18 mΩcm or less, further preferably 17 Ωcm or less. The lower limit of the bulk resistivity is usually 0.1 mΩcm, preferably 1 mΩcm.

The bulk resistivity can be measured by, for instance, a four-probe method.

The sintered oxide according to the exemplary embodiment of the invention has been described as the above.

Next, a production method of the sintered oxide according to the exemplary embodiment of the invention will be described below.

The production method, which is not particularly limited as long as the sintered oxide according to the exemplary embodiment of the invention is producible, may exemplarily include the following steps (a) to (c).

(a) Preparing a mixture by mixing material compound powders.

(b) Preparing a molding body by molding the mixture.

(c) Sintering the molding body.

(1) Step (a): Mixing Step

In a mixing step, the material of the sintered oxide is mixed.

In compound powder, Ga compound powder, Sn compound powder, and Al compound powder are used as the material. Examples of the Al compound include aluminum oxide, and aluminum hydroxide. Examples of the In, Ga, and Sn compounds include In, Ga, and Sn oxides. In terms of adaptability to sintering and unlikelyhood of a residual by-product, all of these compound powders are preferably oxides.

The purity of the material is usually 2N (99 mass %) or more, preferably 3N (99.9 mass %) or more, especially preferably 4N (99.99 mass %) or more. At the purity of 2N or more, the durability of the sintered oxide can be ensured, and the impurities are less likely to enter crystal liquid in a crystal liquid display and, consequently, to cause burn-in.

An average particle size of the material powder is preferably 0.1 μm or more and 2 μm or less, more preferably 0.5 μm or more and 1.5 μm or less. The average particle size of the material powder is measurable using a laser diffraction particle size analyzer or the like.

The method for mixing and molding the material is not specifically limited (i.e. the material may be mixed and molded in any known manner). A binder may be added to the material mixture when the material is mixed.

The material may be mixed using a known apparatus such as a ball mill, bead mill, jet mill, and ultrasonic devices. Conditions for the mixing (e.g. pulverization time) may be determined as required. The pulverization time is preferably in a range from 6 hours to 100 hours.

(2) Step (b): Molding Step

In the molding step, the material mixture (pre-sintered product when the pre-sintering step is conducted) is molded under pressure to form a molding body. Through this step, the material is formed into a shape suitable as a target. When the pre-sintering step is conducted, the resultant particles of the pre-sintered product are pelletized and are subsequently pressed into a desired shape.

An average thickness of the molding body is preferably 5.5 mm or more, more preferably 6 mm or more, further preferably 8 mm or more, and especially preferably 12 mm or more. At the thickness of 5.5 mm or more, a temperature gradient in the thickness direction of the molding body is reduced, so that it is expectable that a change in the combination of crystal types at the surface and a depth part of the molding body is unlikely to occur.

Examples of the molding process usable in the molding step include press molding (uniaxial press), die molding, casting, and injection molding. It is preferable to mold the material using CIP (Cold Isostatic Pressing) in order to obtain a sintered body (target) with a high sintering density.

Two or more molding steps may be conducted, where, for instance, the material is subjected to CIP (Cold Isostatic Pressing), HIP (Hot Isostatic Pressing) or the like after press molding (uniaxial press).

When a CIP or HIP machine is used, a surface pressure is preferably kept at 78.5 MPa (in terms of SI unit equivalent to 800 kgf/cm$^2$) or more and 392.4 MPa (in terms of SI unit equivalent to 4000 kgf/cm$^2$) for 0.5 minutes or more and 60 minutes or less. The surface pressure is preferably 196.2 MPa or more and 294.3 MPa or less and is kept for 2 minutes or more and 30 minutes or less. Within the above range, it is expectable that unevenness in composition or the like inside the molding body is reduced (i.e. the composition is uniformed). At the surface pressure of 78.5 MPa or more, the density after sintering and, consequently, the resistance of the sintered oxide are reduced. At the surface pressure of 392.4 MPa or less, the material can be molded without increasing the size of the molding machine. At a holding time of 0.5 minutes or more, the density and resistance can be kept from being raised after sintering. The holding time of 60 minutes or less is not too time-consuming to be economical.

In the molding process, a molding aid such as polyvinyl alcohol, methyl cellulose, polywax, and oleic acid may be used.

(3) Step (c): Sintering Step

The sintering step is an indispensable step for sintering the molding body obtained in the molding step.

The sintering temperature is preferably in a range from 1200 degrees C. to 1650 degrees C., more preferably from 1350 degrees C. to 1600 degrees C., further preferably from 1400 degrees C. to 1600 degrees C., furthermore preferably from 1450 degrees C. to 1600 degrees C.

The sintering time is preferably in a range from 10 hours to 50 hours, more preferably from 12 hours to 40 hours, further preferably from 13 hours to 30 hours.

At the sintering temperature of 1200 degrees C. or more and the sintering time of 10 hours or more, the target so sufficiently sintered that the electric resistance of the target is sufficiently lowered and the abnormal electrical discharge is unlikely to occur. At the sintering temperature of 1650 degrees C. or less and the sintering time of 50 hours or less, an increase in the average particle size and occurrence of coarse vacancy due to eminent growth in crystal grains can be prevented, so that the strength of the sintered body is not likely to be decreased and the abnormal electrical discharge is not likely to occur.

In a normal pressure sintering, the molding body is sintered in an atmospheric air or oxygen-gas atmosphere. In the oxygen-gas atmosphere, it is preferable that the oxygen concentration is, for instance, 20 volume % or more and 80 volume % or less. The density of the sintered body can be increased by performing a temperature-increase step in the oxygen-gas atmosphere.

A temperature increase rate in the sintering process is preferably 0.1 degrees C./min to 2 degrees C./min in a temperature range from 800 degrees C. to the sintering temperature.

The sintering process in the sintered body according to the exemplary embodiment of the invention most effectively progresses in the temperature range at or above 800 degrees C. At the temperature increase rate of 0.1 degrees C./min or more in this temperature range, excessive growth of the crystal grains can be restrained, achieving a high-density sintered body. At the temperature increase rate of 2 degrees C./min or less, warpage or cracks on the sintered body, which is caused due to uneven temperature distribution in the molding body, can be restrained.

The temperature increase rate in the temperature range from 800 degrees C. to the sintering temperature is preferably in a range from 0.5 degrees C./min to 2.0 degrees C./min, more preferably 1.0 degree C./min to 1.8 degrees C./min.

Sputtering Target

The sputtering target according to an exemplary embodiment of the invention will be more specifically described below with reference to FIGS. 1A to 1D.

The sintered oxide is ground and bonded to a backing plate to be formed into the sputtering target. An oxide semiconductor film can be formed through sputtering using the sputtering target.

The sputtering target according to the exemplary embodiment of the invention (sometimes referred to as the present target hereinafter) includes the above sintered oxide (sometimes referred to as the present sintered oxide hereinafter), and the backing plate. The sputtering target according to the exemplary embodiment of the invention preferably includes the present sintered oxide and, as necessary, a cooler/holder (e.g. the backing plate) provided on the sintered oxide.

The sintered oxide (target material) of the present target is provided by grinding a surface of the above-described present sintered oxide. Accordingly, the substance of the target material is the same as the present sintered oxide. The explanation on the present sintered oxide thus directly applies to the target material.

Figure 1B:
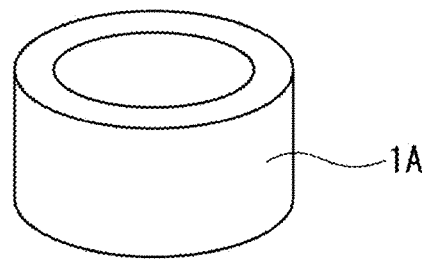
FIG. 1B is a perspective view showing a shape of a target according to another exemplary embodiment of the invention.
Figure 1C:
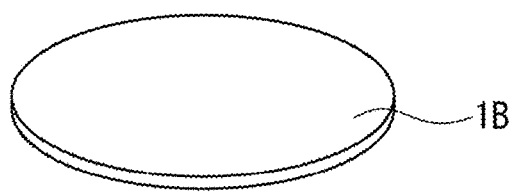
FIG. 1C is a perspective view showing a shape of a target according to still another exemplary embodiment of the invention.
Figure 1D:
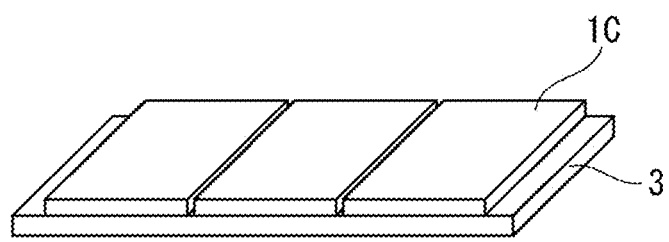
FIG. 1D is a perspective view showing a shape of a target according to a further exemplary embodiment of the invention.

The shape of the sintered oxide is not particularly limited. For instance, the sintered oxide may be in a plate as shown in FIG. 1A (item 1) or a hollow cylinder as shown in FIG. 1B (item 1A). When the sintered oxide is plate-shaped, the sintered oxide may be rectangular in a plan view as shown in FIG. 1A (item 1) or circular in a plan view as shown in FIG. 1C (item 1B). The sintered oxide may be a single-piece molding or may be a multiple-division component including a plurality of divided sintered oxides (item 1C) fixed on a backing plate 3 as shown in FIG. 1D.

The backing plate 3 is the holder/cooler for the sintered oxide. The backing plate 3 is preferably made of a material with excellent thermal conductivity (e.g. copper).

The sputtering target is produced through, for instance, the following steps.

(d) Grinding a surface of the sintered oxide (grinding step).

(e) Bonding the sintered oxide on the backing plate (bonding step).

The above steps will be specifically described below.

(4) Step (d): Grinding Step

In the grinding step, the sintered body is ground into a shape adapted to be attached to a sputtering apparatus.

The surface of the sintered body is often partially highly oxidized or roughened. Further, the sintered body has to be cut into piece(s) of a predetermined size.

The surface of the sintered body is preferably ground for 0.3 mm or more. The grinding depth is more preferably 0.5 mm or more, especially preferably 2 mm or more. A part of the sintered body at or near the surface thereof, at which crystal structure is modified, can be removed by grinding 0.3 mm or more.

It is preferable to grind the sintered oxide using, for instance, a surface grinder to form a material whose average surface roughness Ra is 5 μm or less. A sputtering surface of the sputtering target may further be mirror-finished so that the average surface roughness Ra is $1000\times10^{-10}$ m or less. The mirror-finishing (polishing) may be performed using any known polishing technique including mechanical polishing, chemical polishing, and mechanochemical polishing (combination of the mechanical polishing and chemical polishing). For instance, the surface may be polished using a fixed-abrasive-grain polisher (polishing liquid: water) to P2000 or finer grit size, or may be lapped using diamond-paste polishing material after lapping using a loose-abrasive-grain lapping material (polishing material: SiC paste etc.). The polishing method is not limited to the above. Examples of the polishing material include a polishing material with P200 grit size, P400 grit size, and P800 grit size.

The sintered oxide after the polishing step is preferably cleaned with an air blower or washed with running water and the like. When a foreign substance is to be removed using an air blower, air is preferably sucked with a dust catcher provided at a side opposite a nozzle for effective removal. It should be noted that ultrasonic cleaning may further be performed in view of the limited cleaning power of the air blower and running water. The ultrasonic cleaning is effectively performed with multiple frequencies ranging from 25 kHz to 300 kHz. For instance, twelve waves of different frequencies ranging from 25 kHz to 300 kHz in 25 kHz increments are preferably applied for the ultrasonic cleaning.

(5) Step (e): Bonding Step

In the step (e), the sintered body after being ground is bonded to the backing plate using a low-melting-point metal such as indium.

The sputtering target has been described as the above.

Oxide Semiconductor Thin-Film

Next, an amorphous oxide semiconductor thin-film according to an exemplary embodiment of the invention will be described below.

An oxide semiconductor film according to an exemplary embodiment of the invention (sometimes simply referred to as the present semiconductor film) contains In, Ga, and Sn at atomic ratios of:

$$0.01 \leq Ga/(In+Ga+Sn) \leq 0.30 \quad (1),$$

$$0.01 \leq Sn/(In+Ga+Sn) \leq 0.40 \quad (2), \text{ and}$$

$$0.55 \leq In/(In+Ga+Sn) \leq 0.98 \quad (3), \text{ and}$$

Al at an atomic ratio of:

$$0.05 \leq Al/(In+Ga+Sn+Al) \leq 0.30 \quad (4).$$

The present semiconductor film is suitably usable for a semiconductor layer (semiconductor portion) of a thin-film transistor.

The present semiconductor film of the above atomic ratio composition can be provided by a sputtering process using the present sputtering target of the same atomic ratio composition.

An atomic ratio composition of a film provided by a sputtering process using a sputtering target made of a sintered oxide becomes similar to the atomic ratio composition of the used sputtering target.

The present semiconductor film of the exemplary embodiment is preferably amorphous when being formed through sputtering, and is preferably kept amorphous after a heat treatment (annealing process). Once an indium oxide crystal is formed, tin is sometimes doped to the indium oxide crystal so that the semiconductor film becomes electrically conductive as in ITO. When the indium oxide crystal is in a form of fine crystals, there are amorphous crystals and the fine crystals simultaneously in the semiconductor film, where carriers may be scattered at interfaces of the amorphous and fine crystals to reduce the carrier mobility. Further, oxygen vacancy or the like, which possibly occurs between the amorphous crystals and the fine crystals, may form a color center of absorbing light, impairing optical stability of TFT.

When an oxide semiconductor film whose atomic ratio composition is outside the above range is subjected to a process in a CVD film-formation apparatus used for forming a thin-film transistor, the carrier concentration of the semiconductor portion (the present semiconductor film) of the thin-film transistor is sometimes increased, which is not decreased even after the subsequent annealing, thus failing to function as TFT. Accordingly, the film-formation temperature of the CVD apparatus has been reduced to restrain the increase in the carrier concentration in order to exhibit the TFT performance. However, due to the reduction in the film-formation temperature in the CVD apparatus, the resultant semiconductor film may be poor in durability, and also in the TFT performance.

In the present semiconductor film, gallium oxide is effective in reducing occurrence of oxygen vacancy and increasing the band gap in the oxide semiconductor film. A Ga ratio [Ga/(In+Ga+Sn) (atomic ratio)] is preferably $0.01 \leq Ga/(In+Ga+Sn) \leq 0.30$. When the Ga ratio is less than 0.01, the oxygen vacancy is hardly reduced, thereby sometimes failing to form the semiconductor film. When the Ga ratio is more than 0.30, the resultant film may become an insulation film due to elimination of the oxygen vacancy. More preferably, $0.02 \leq Ga/(In+Ga+Sn) \leq 0.27$, further preferably, $0.03 \leq Ga/(In+Ga+Sn) \leq 0.23$.

In the present semiconductor film, tin oxide is chemically resistant and, as can be understood as a usage in electro-conductive film, is believed to hardly affect the carrier mobility in the semiconductor film. Accordingly, the Sn ratio [Sn/(In+Ga+Sn) (atomic ratio)] is preferably $0.01 \leq Sn/(In+Ga+Sn) \leq 0.40$. When the Sn ratio is less than 0.01, the chemical resistance may not be exhibited. When the Sn ratio is more than 0.40, the chemical resistance may be too high to etch the semiconductor film to form island(s) of the semiconductor film. More preferably, $0.02 \leq Sn/(In+Ga+Sn) \leq 0.35$, further preferably, $0.03 \leq Sn/(In+Ga+Sn) \leq 0.30$.

In the present semiconductor film, indium oxide ensures the carrier mobility in the semiconductor film. The In ratio

[In/(In+Ga+Sn) (atomic ratio)] is preferably 0.55≤In/(In+Ga+Sn)≤0.98. When the In ratio is less than 0.55, the carrier mobility in the semiconductor film may be lowered. The In ratio of more than 0.98 may cause crystallization or too much oxygen vacancy to form a semiconductor film (i.e. the film may become a conductor). More preferably, 0.60≤In/(In+Ga+Sn)≤0.96, further preferably, 0.60≤In/(In+Ga+Sn)≤0.94.

In the present semiconductor film, the aluminum oxide serves to turn/keep the semiconductor film amorphous, and to reduce carriers from being generated by oxygen vacancy. Unless the amount of the aluminum oxide is relatively increased in an oxide semiconductor film with a large fraction of indium oxide in the base material oxide, the semiconductor film may be crystallized, and carrier increase, which is caused due to dopant effect of tin oxide caused by crystallization and the oxygen vacancy in an amorphous state, cannot be restrained. Meanwhile, in an oxide semiconductor film with a small fraction of indium oxide in the base material oxide, unless the amount of the aluminum oxide is relatively reduced, the semiconductor film may become insulative and the carrier mobility in the thin-film transistor using the oxide semiconductor film may be decreased.

Thus, the ratio of Al should be adjusted depending on the In ratio in the base material oxide.

For instance, at the In ratio [In/(In+Ga+Sn) (atomic ratio)] of 0.85 or more, the Al ratio [Al/(In+Ga+Sn+Al) (atomic ratio)] is 0.10 or more, preferably 0.12 or more, and is preferably at most 0.30 or less. At the In ratio [In/(In+Ga+Sn) (atomic ratio)] of 0.85 or more, the semiconductor film may become easily crystallized. In order to restrain the crystallization, the amount of the added Al should be preferably increased. The amount of the added Al should also be preferably increased in order to restrain the carriers from being generated due to the increase in the oxygen vacancy in the indium oxide in accordance with the increase in the In ratio.

At the In ratio [In/(In+Ga+Sn) (atomic ratio)] of 0.70 or less, the added Al ratio [Al/(In+Ga+Sn+Al) (atomic ratio)] is preferably 0.20 or less, more preferably 0.15 or less. More preferably, the added Al ratio is 0.13 or less, more preferably 0.12 or less. The lower limit is preferably 0.05 or more.

Al has a large ability in restraining the generation of carriers due to oxygen vacancy. For instance, Al has high performance in restoring the carrier concentration of the carriers, which are generated in the semiconductor film when an interlayer insulating film and/or gate insulating film is formed through CVD (Chemical Vapor Deposition) process or the like, to a normal carrier concentration during a subsequent annealing treatment. It has been found that the above-described property of Al allows the carrier concentration, which may be increased once during to the CVD process, to return to a normal level (i.e. for a film to be capable of serving as a semiconductor) during the subsequent annealing, thereby restoring the TFT performance.

At the In ratio [In/(In+Ga+Sn) (atomic ratio)] of the intermediate range (i.e. in a range of more than 0.70 and less than 0.85), film-formation conditions (e.g. oxygen concentration, substrate temperature, film-formation pressure, and back-pressure) should be appropriately adjusted. At the above intermediate range (i.e. more than 0.70 and less than 0.85) of the In ratio [In/(In+Ga+Sn) (atomic ratio)], when the Ga ratio [Ga/(In+Ga+Sn) (atomic ratio)] exceeds 0.10, since amorphizing effect and carrier control effects of the gallium oxide are exhibited, the Al ratio [Al/(In+Ga+Sn+Al) (atomic ratio)] is not necessary to be as high as the ratio when the In ratio [In/(In+Ga+Sn) (atomic ratio)] is 0.85 or more. However, in order to provide CVD resistance or the like or further improve the durability of the semiconductor film depending on the usage of the semiconductor film, the amount of the added Al may be approximately the same as the amount when the In ratio [In/(In+Ga+Sn) (atomic ratio)] is 0.85 or more.

Meanwhile, when the Sn ratio [Sn/(In+Ga+Sn) (atomic ratio)] exceeds 0.20, the chemical resistance becomes so high that a semiconductor film resistant to etching process and the like can be obtained. The Al ratio may be appropriately adjusted in view of the CVD resistance and durability of TFT. When the present semiconductor film is used for a thin-film transistor with high carrier mobility, the Al ratio [Al/(In+Ga+Sn+Al) (atomic ratio)] can be reduced to the Al ratio when the In ratio [In/(In+Ga+Sn) (atomic ratio)] is 0.85 or less. Thus, a thin-film transistor using an oxide semiconductor film with high carrier mobility can be provided.

The added gallium oxide and/or aluminum oxide improves the band gap of the oxide semiconductor film, so that an oxide semiconductor film and thin-film transistor (TFT) with high light resistance can be easily provided. The amounts of the gallium oxide and the aluminum oxide, which are closely related to the amount of the oxygen vacancy, should be appropriately adjusted in accordance with the required durability depending on the usage of the resultant semiconductor film.

The oxide semiconductor film according to the exemplary embodiment of the invention more preferably contains In, Ga and Sn at atomic ratios of:

$$0.02 \leq Ga/(In+Ga+Sn) \leq 0.27 \qquad (1A);$$

$$0.02 \leq Sn/(In+Ga+Sn) \leq 0.35 \qquad (2A); \text{ and}$$

$$0.60 \leq In/(In+Ga+Sn) \leq 0.96 \qquad (3A),$$

and Al at an atomic ratio of:

$$0.05 \leq Al/(In+Ga+Sn+Al) \leq 0.30 \qquad (4).$$

The oxide semiconductor film according to the exemplary embodiment of the invention more preferably contains In, Ga and Sn at atomic ratios of:

$$0.03 \leq Ga/(In+Ga+Sn) \leq 0.23 \qquad (1B);$$

$$0.03 \leq Sn/(In+Ga+Sn) \leq 0.30 \qquad (2B); \text{ and}$$

$$0.60 \leq In/(In+Ga+Sn) \leq 0.94 \qquad (3B),$$

and Al at an atomic ratio of:

$$0.08 \leq Al/(In+Ga+Sn+Al) \leq 0.22 \qquad (46).$$

The content (atomic ratio) of each of the metal elements in the oxide semiconductor film can be determined by measuring the amount of the elements through ICP (Inductive Coupled Plasma) measurement or XRF (X-Ray Fluorescence) measurement. An inductively coupled plasma emission spectrometer can be used for the ICP measurement. A thin-film X-ray fluorescence spectrometer (AZX400, manufactured by Rigaku Corporation) can be used for the XRF measurement.

A sector-dynamic SIMS (Secondary Ion Mass Spectrometer) analysis may alternatively be used for analysis of the contents (atomic ratio) of the metal elements in the oxide semiconductor thin-film at the same accuracy as the inductively coupled plasma emission spectrometry or the thin-film X-ray fluorescence spectrometry. A reference material is prepared by forming source/drain electrodes (made of the same material as in TFT device) of a channel length on an upper surface of a reference oxide thin-film whose atomic ratio of the metal elements are known by measurement using the inductively coupled plasma emission spectrometer or the thin-film X-ray fluorescence spectrometer. Then, the oxide semiconductor layer is analyzed using a sector-dynamic SIMS (Secondary Ion Mass Spectrometer) (IMS 7f-Auto, manufactured by AMETEK, Inc.) to measure a mass spectrum intensity of each of the elements, and plot analytical curves for concentrations of the known elements and the mass spectrum intensity. Next, the atomic ratio in the oxide semiconductor film of an actual TFT device is calculated with reference to the above-described analytical curve based on the spectrum intensity obtained by the sector-dynamic SIMS (Secondary Ion Mass Spectrometry) analysis. As a result of the calculation, it is found that the calculated atomic ratio is within 2 at. % of the atomic ratio of the oxide semiconductor film separately measured by the thin-film X-ray fluorescent spectrometer or the inductively coupled plasma emission spectrometer.

Thin-Film Transistor

Next, a structure of a thin-film transistor according to an exemplary embodiment of the invention will be described below.

A feature of a thin-film transistor according to an aspect of the invention (sometimes referred to as the present TFT hereinafter) is the use of the present oxide semiconductor film.

Though not particularly limited, the thin-film transistor according to the exemplary embodiment of the invention is preferably configured as a back-channel etching transistor, etching stopper transistor, a top-gate transistor or the like.

Figure 2:
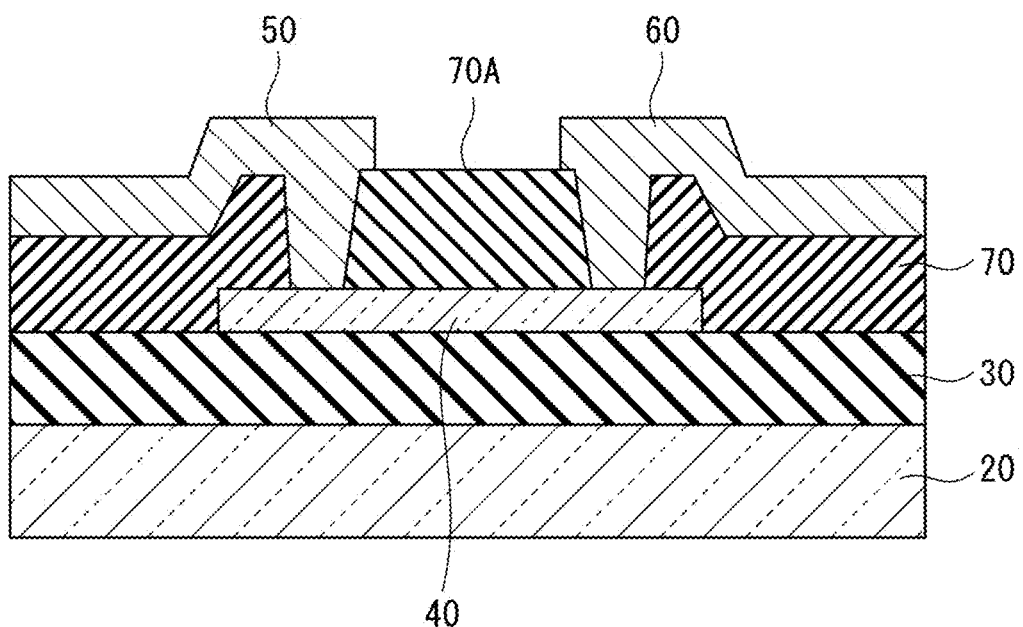
FIG. 2 is a vertical cross section showing a thin-film transistor according to an exemplary embodiment of the invention.
Figure 3:
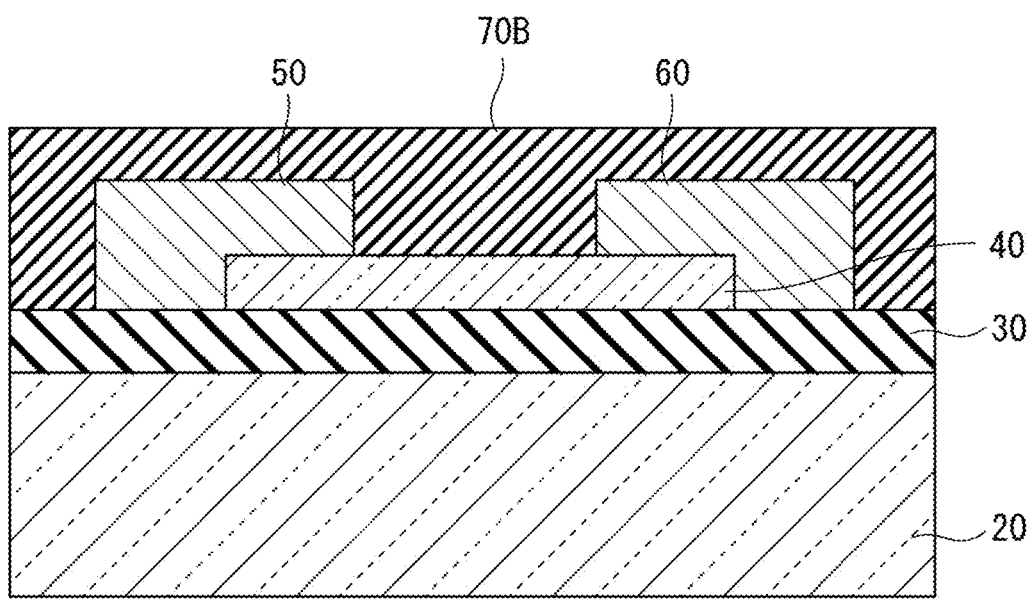
FIG. 3 is a vertical cross section showing a thin-film transistor according to another exemplary embodiment of the invention.

Specific examples of the thin-film transistor are shown in FIGS. 2 and 3.

As shown in FIG. 2, a thin-film transistor 100 includes a silicon wafer 20, a gate insulating film 30, an oxide semiconductor thin-film 40, a source electrode 50, a drain electrode 60, and interlayer insulating films 70, 70A.

The silicon wafer 20 defines a gate electrode. The gate insulating film 30, which is an insulation film for insulation between the gate electrode and the oxide semiconductor thin-film 40, is provided on the silicon wafer 20.

The oxide semiconductor thin-film 40 (channel layer) is provided on the gate insulating film 30. The oxide semiconductor thin-film 40 is the oxide semiconductor thin-film according to an exemplary embodiment of the invention.

The source electrode 50 and the drain electrode 60, which are conductive terminals for passing source current and drain current through the oxide semiconductor thin-film 40, are in contact with parts near respective ends of the oxide semiconductor thin-film 40.

The interlayer insulating film 70 is an insulation film for insulating parts other than the contact portions between the source electrode 50 (drain electrode 60) and the oxide semiconductor thin-film 40.

The interlayer insulating film 70A is another insulation film for insulating parts other than the contact portions between the source electrode 50 and drain electrode 60, and the oxide semiconductor thin-film 40. The interlayer insulating film 70A is also an insulation film for insulation between the source electrode 50 and the drain electrode 60, and also serves as a protection layer for the channel layer.

As shown in FIG. 3, the structure of a thin-film transistor 100A is substantially the same as the thin-film transistor 100, except that the source electrode 50 and the drain electrode 60 are in contact with both of the gate insulating film 30 and the oxide semiconductor thin-film 40, and that an interlayer insulating film 70B is integrally provided to cover the gate insulating film 30, the oxide semiconductor thin-film 40, the source electrode 50, and the drain electrode 60.

The material for the drain electrode 60, the source electrode 50 and the gate electrode are not particularly limited but may be selected from generally known materials. In the examples shown in FIGS. 2 and 3, the silicon wafer is used for the substrate. Though the silicon wafer also serves as an electrode, the material of the electrode is not necessarily silicon.

For instance, the electrode may be a transparent electrode made of Indium Tin Oxide (ITO), Indium Zinc Oxide (IZO), ZnO, and SnO$_2$, a metal electrode made of Al, Ag, Cu, Cr, Ni, Mo, Au, Ti, Ta, or the like, a metal electrode made of an alloy containing the above metal elements, or a laminated electrode of layers made of the alloy.

The gate electrode shown in FIGS. 2 and 3 may be formed on a substrate made of glass or the like.

The material for the interlayer insulating films 70, 70A and 70B is not particularly limited but may be selected as desired from generally known materials. Specifically, the interlayer insulating films 70, 70A, 70B may be made of a compound such as SiO$_2$, SiNx, Al$_2$O$_3$, Ta$_2$O$_5$, TiO$_2$, MgO, ZrO$_2$, CeO$_2$, K$_2$O, Li$_2$O, Na$_2$O, Rb$_2$O, Sc$_2$O$_3$, Y$_2$O$_3$, HfO$_2$, CaHfO$_3$, PbTiO$_3$, BaTa$_2$O$_6$, SrTiO$_3$, Sm$_2$O$_3$, and AlN.

When the thin-film transistor according to the exemplary embodiment of the invention is a back-channel-etching (bottom-gate) thin-film transistor, it is preferable to provide a protection film on the drain electrode, the source electrode and the channel layer. The protection film enhances the durability against a long-term driving of the TFT. In a top-gate TFT, the gate insulating film is formed on, for instance, the channel layer.

The protection film or the insulation film can be formed, for instance, through a CVD process, which sometimes entails high-temperature treatment. The protection film or the insulation film often contains impurity gas immediately after being formed, and thus preferably is subjected to a heat treatment (annealing). The heat treatment removes the impurity gas to provide a stable protection film or insulation film, and, consequently, highly durable TFT device.

With the use of the oxide semiconductor thin-film according to the exemplary embodiment of the invention, the TFT device is less likely to be affected by the temperature in the CVD process and the subsequent heat treatment. Accordingly, the stability of the TFT performance can be enhanced even when the protection film or the insulation film is formed.

The thin-film transistor preferably has the following properties.

The carrier mobility in the thin-film transistor is preferably 1.0 cm$^2$/V·s or more. At the carrier mobility of 1.0 cm$^2$/V·s or more, a liquid crystal display can be driven.

The saturation mobility is determined based on a transfer function when a 20 V drain voltage is applied. Specifically, the saturation mobility can be calculated by: plotting a graph of a transfer function Id-Vg; calculating transconductance (Gm) for each Vg; and calculating the saturation mobility using a formula in a saturated region. It should be noted Id represents a current between the source and drain electrodes, and Vg represents a gate voltage when the voltage Vd is applied between the source and drain electrodes.

A threshold voltage (Vth) is preferably in a range from −3.0 V to 3.0 V, more preferably from −2.0 V to 2.0 V, further preferably from −1.0 V to 1.0 V. At the threshold voltage (Vth) of −3.0 V or more, a thin-film transistor with high carrier mobility can be provided. At the threshold voltage (Vth) of 3.0 V or less, a thin-film transistor with small off current and large On/Off ratio can be provided.

The threshold voltage (Vth) is defined as Vg at Id=$10^{-9}$ A based on the graph of the transfer function.

The On/Off ratio is preferably in a range from $10^6$ to $10^{12}$, more preferably from $10^7$ to $10^{11}$, further preferably from $10^8$ to $10^{10}$. At the On/Off ratio of $10^6$ or more, a liquid crystal display can be driven. At the On/Off ratio of $10^{12}$ or less, an organic EL device with a large contrast can be driven. Further, the off current can be set at $10^{-12}$ A or less, allowing an increase in image-holding time and improvement in sensitivity when the present transistor is used for a transfer transistor or a reset transistor of a CMOS image sensor.

The On/Off ratio can be determined as a ratio [On current value/Off current value] of On current value (a value of Id when Vg=20 V) to Off current value (a value of Id when Vg=−10 V).

The On current value is preferably $10^{-10}$ A or less, more preferably $10^{-11}$ A or less, further preferably $10^{-12}$ A or less. At the Off current value of $10^{-10}$ A or less, an organic EL device with a large contrast can be driven. Further, the image-holding time can be increased and sensitivity can be enhanced when the thin-film transistor is used for a transfer transistor or a reset transistor of a CMOS image sensor.

The defect density of the amorphous oxide semiconductor thin-film according to the exemplary embodiment of the invention, which is used in a semiconductor layer of the thin-film transistor, is preferably $5.0 \times 10^{16}$ cm$^{-3}$ or less, more preferably $1.0 \times 10^{16}$ cm$^{-3}$ or less. With the decrease in the defect density, the carrier mobility in the thin-film transistor is further improved, thereby enhancing the stability to irradiated light and heat and allowing stable operation of the TFT.

Quantum-Tunneling Field-Effect Transistor

The oxide semiconductor thin-film according to the exemplary embodiment of the invention is also usable for a quantum-tunneling Field-Effect Transistor (FET).

Figure 4:
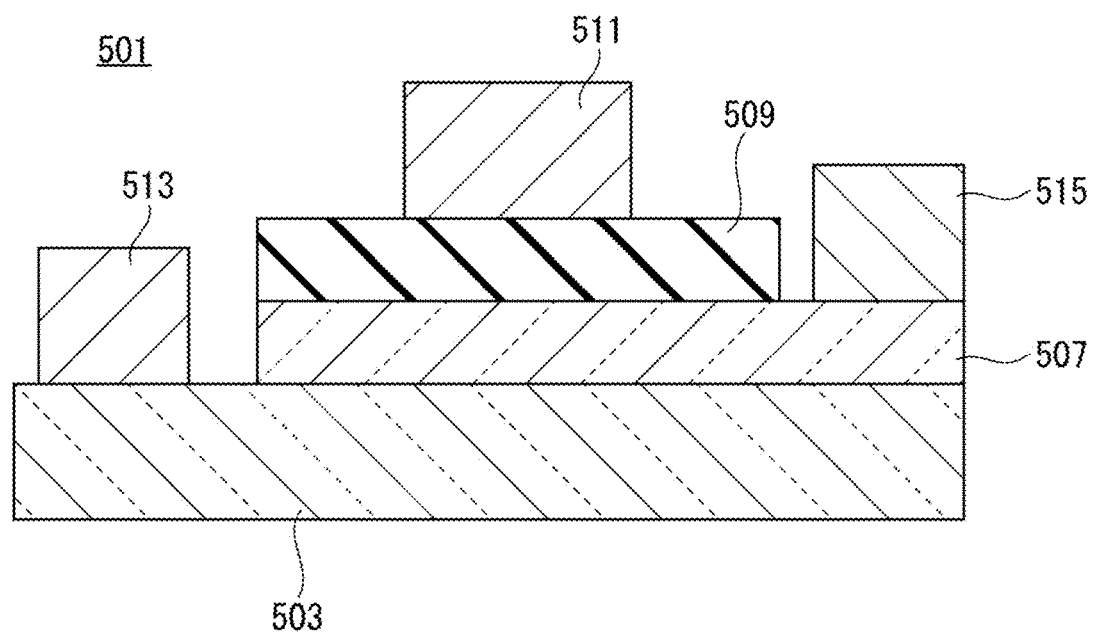
FIG. 4 is a vertical cross section showing a quantum-tunneling field-effect transistor according to an exemplary embodiment of the invention.

FIG. 4 is a schematic illustration (vertical cross section) of a quantum-tunneling FET (Field-Effect Transistor) according to an exemplary embodiment.

A quantum-tunneling field-effect transistor 501 includes a p-type semiconductor layer 503, an n-type semiconductor layer 507, a gate insulating film 509, a gate electrode 511, a source electrode 513, and a drain electrode 515.

The p-type semiconductor layer 503, the n-type semiconductor layer 507, the gate insulating film 509, and the gate electrode 511 are layered in this order.

The source electrode 513 is provided on the p-type semiconductor layer 503. The drain electrode 515is provided on the n-type semiconductor layer 507.

The p-type semiconductor layer 503 is a layer of a p-type IV group semiconductor layer, which is a p-type silicon layer in the exemplary embodiment.

The n-type semiconductor layer 507 is an n-type oxide semiconductor thin-film used in an image sensor according to the exemplary embodiment. The source electrode 513 and the drain electrode 515 are conductive films.

Though not shown in FIG. 4, an insulation layer may be provided on the p-type semiconductor layer 503. In this case, the p-type semiconductor layer 503 and the n-type semiconductor layer 507 are connected through a contact hole(s) defined by partially removing the insulation layer. Though not shown in FIG. 4, the quantum-tunneling field-effect transistor 501 may be provided with an interlayer insulating film covering an upper side of the quantum-tunneling field-effect transistor 501.

The quantum-tunneling field-effect transistor 501 is a current-switching quantum-tunneling FET (Field-Effect Transistor) for controlling the electric current tunneled through an energy barrier formed by the p-type semiconductor layer 503 and the n-type semiconductor layer 507 using a voltage applied to the gate electrode 511. With this structure, the band gap of the oxide semiconductor of the n-type semiconductor layer 507 can be increased, thereby decreasing the off current.

Figure 5:
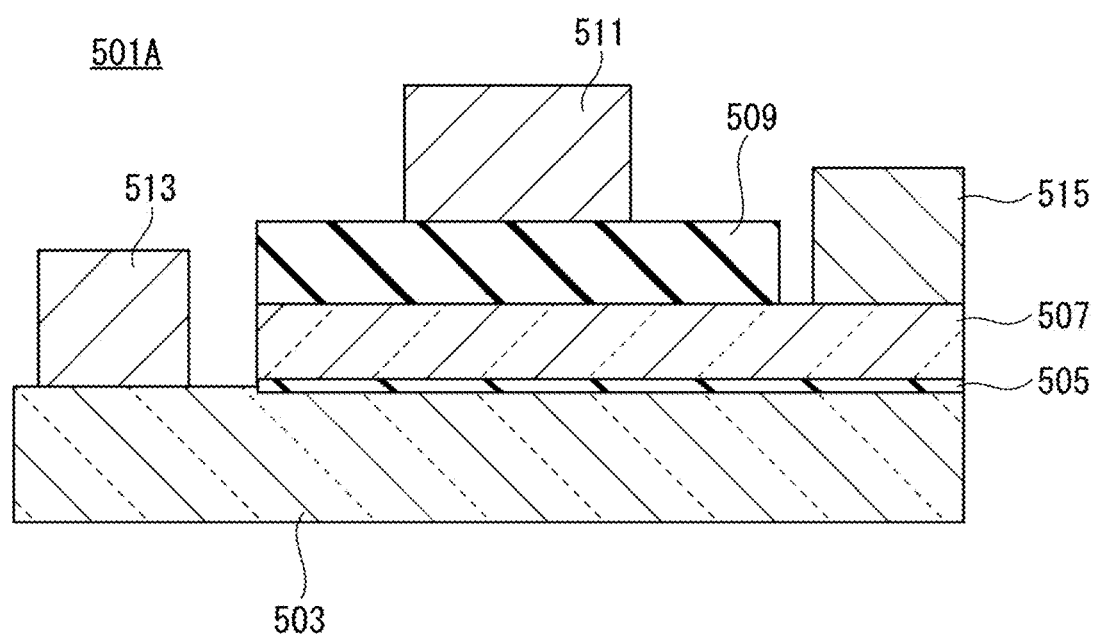
FIG. 5 is a vertical cross section showing a quantum-tunneling field-effect transistor according to another exemplary embodiment of the invention.

FIG. 5 is a schematic illustration (vertical cross section) of a quantum-tunneling field-effect transistor 501A according to another exemplary embodiment.

The structure of the quantum-tunneling field-effect transistor 501A is the same as the structure of the quantum-tunneling field-effect transistor 501 except that a silicon oxide layer 505 is interposed between the p-type semiconductor layer 503 and the n-type semiconductor layer 507. The off current can be reduced by the presence of the silicon oxide layer.

The thickness of the silicon oxide layer 505 is preferably 10 nm or less. At the thickness of 10 nm or less, the tunnel current securely passes through the energy barrier and the energy barrier can be securely formed with a constant barrier height, preventing the decrease or change in the tunneling current. The thickness is preferably 8 nm or less, more preferably 5 nm or less, further preferably 3 nm or less, and especially preferably 1 nm or less.

Figure 6:
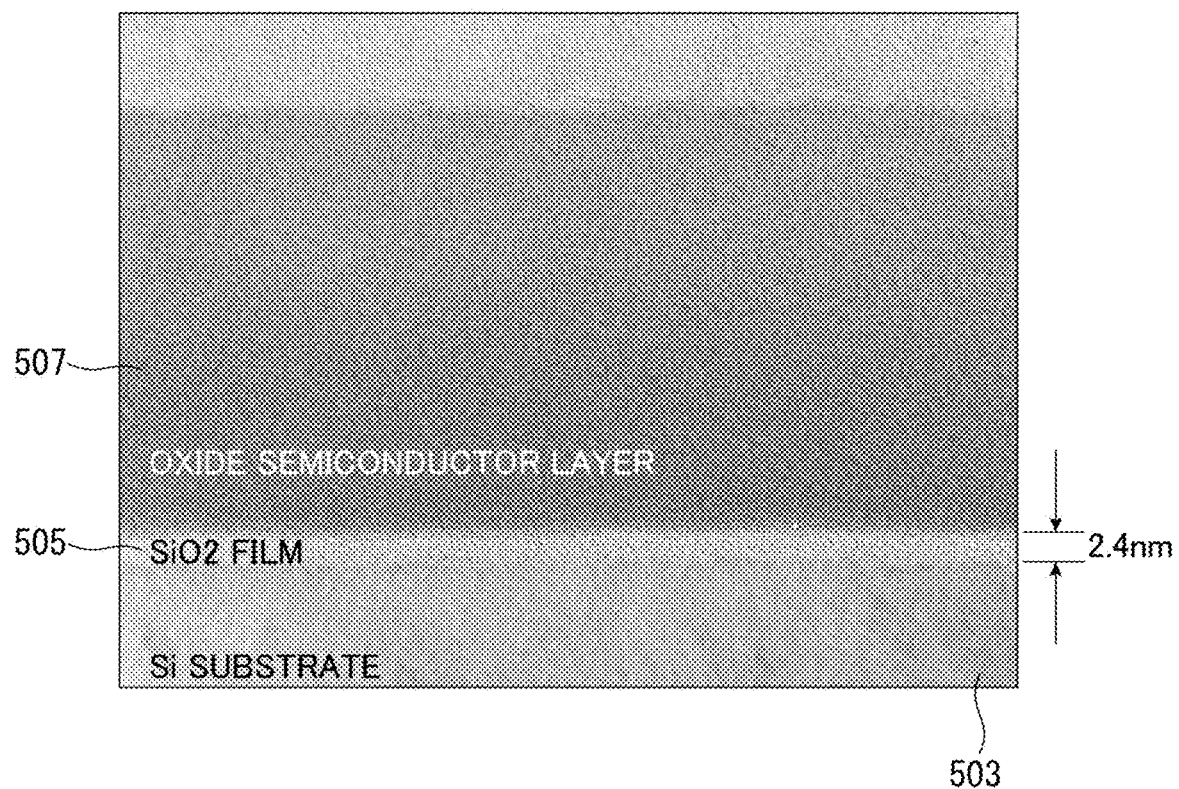
FIG. 6 is a photograph taken by a TEM (Transmission Electron Microscope) showing a silicon oxide layer between a p-type semiconductor layer and an n-type semiconductor layer shown in FIG. 5.

FIG. 6 is a TEM photograph showing the silicon oxide layer 505 between the p-type semiconductor layer 503 and the n-type semiconductor layer 507.

The n-type semiconductor layer 507 in both of the quantum-tunneling field-effect transistors 501 and 501A is an n-type oxide semiconductor.

The oxide semiconductor of the n-type semiconductor layer 507 may be amorphous. The amorphous oxide semiconductor can be etched using an organic acid (e.g. oxalic acid) at a large difference in etching rate from the other layer(s), so that the etching process can be favorably performed without any influence on the metal layer (e.g. wiring).

The oxide semiconductor of the n-type semiconductor layer 507 may alternatively be crystalline. The crystalline oxide semiconductor exhibits a larger band gap than the amorphous oxide semiconductor, so that the off current can be reduced. Further, since the work function can be increased, the control over the current tunneled through the energy barrier formed by the p-type IV group semiconductor material and the n-type semiconductor layer 507 can be facilitated.

A non-limiting example of the production method of the quantum-tunneling field-effect transistor 501 will be described below.

Figure 7A:
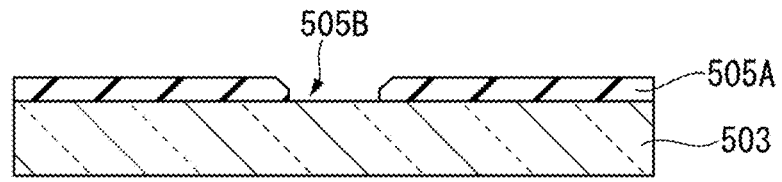
FIG. 7A is a vertical cross section showing a step in a production process of the quantum-tunneling field-effect transistor.

Initially, as shown in FIG. 7A, an insulation film 505A is formed on the p-type semiconductor layer 503. Then, a part of the insulation film 505A is removed by etching or the like to form a contact hole 505B.

Figure 7B:
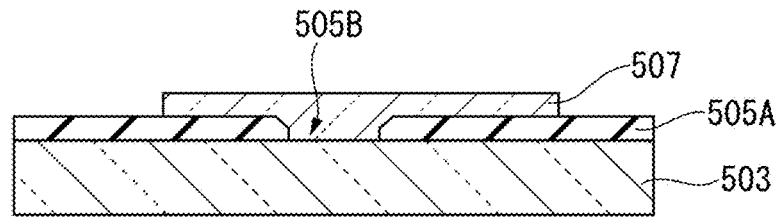
FIG. 7B is a vertical cross section showing another step in the production process of the quantum-tunneling field-effect transistor.

Subsequently, as shown in FIG. 7B, the n-type semiconductor layer 507 is formed on the p-type semiconductor layer 503 and the insulation film 505A. At this time, the p-type semiconductor layer 503 and the n-type semiconductor layer 507 are connected through the contact hole 505B.

Figure 7C:
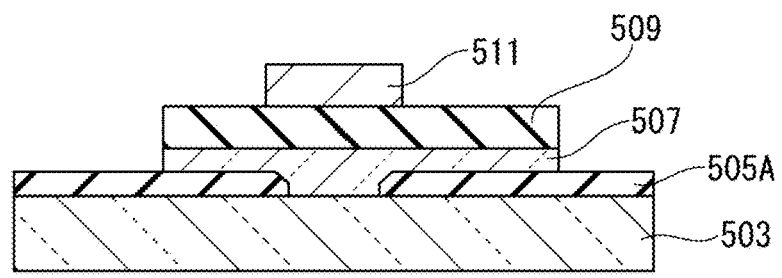
FIG. 7C is a vertical cross section showing a still another step in the production process of the quantum-tunneling field-effect transistor.

Subsequently, as shown in FIG. 7C, the gate insulating film 509 and the gate electrode 511 are formed in this order on the n-type semiconductor layer 507.

Figure 7D:
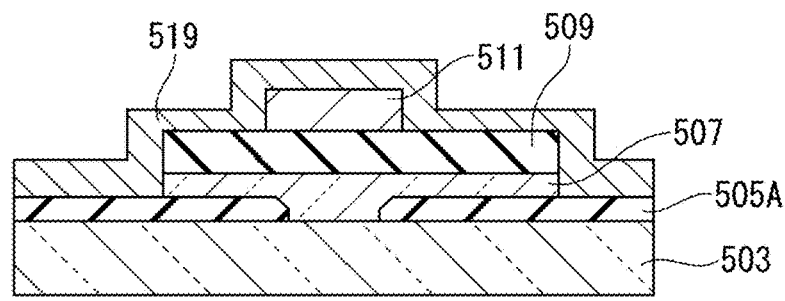
FIG. 7D is a vertical cross section showing a further step in the production process of the quantum-tunneling field-effect transistor.

Then, as shown in FIG. 7D, an interlayer insulating film 519 is formed to cover the insulation film 505A, the n-type semiconductor layer 507, the gate insulating film 509 and the gate electrode 511.

Figure 7E:
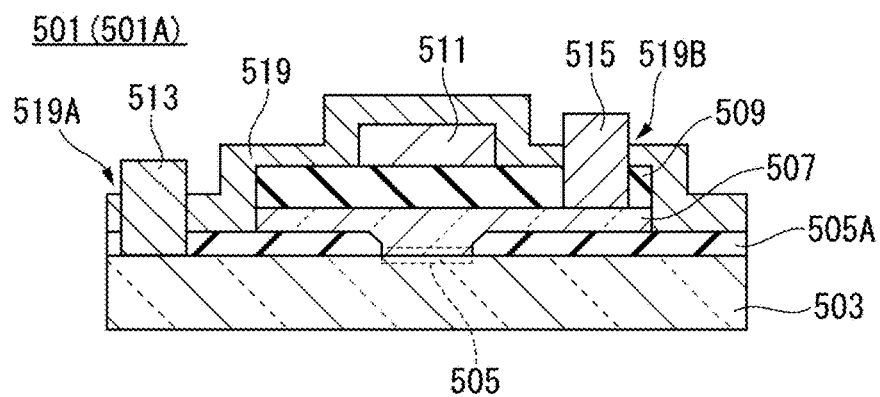
FIG. 7E is a vertical cross section showing a still further step in the production process of the quantum-tunneling field-effect transistor.

Next, as shown in FIG. 7E, the insulation film 505A on the p-type semiconductor layer 503 and the interlayer insulating film 519 are partially removed to form a contact hole 519A, in which the source electrode 513 is provided.

Further, as shown in FIG. 7E, the gate insulating film 509 on the n-type semiconductor layer 507 and the interlayer insulating film 519 are partially removed to form a contact hole 519B, in which the drain electrode 515 is formed.

The quantum-tunneling field-effect transistor 501 is produced through the above process.

It should be noted that the silicon oxide layer 505 between the p-type semiconductor layer 503 and the n-type semiconductor layer 507 can be formed by applying a heat treatment at a temperature ranging from 150 degrees C. to 600 degrees C. after the n-type semiconductor layer 507 is formed on the p-type semiconductor layer 503. The quantum-tunneling field-effect transistor 501A can be produced through the process including the above additional step.

Usage of Thin-Film Transistor

The thin-film transistor according to the exemplary embodiment of the invention is also capable of being embodied as various integrated circuits such as a field-effect transistor, logic circuit, memory circuit, and differential amplifier, which are applicable to electronic devices. Further, the thin-film transistor according to the exemplary embodiment of the invention is also applicable to an electrostatic inductive transistor, Schottky barrier transistor, Schottky diode, and resistor, in addition to the field-effect transistor.

The thin-film transistor according to the exemplary embodiment of the invention is suitably usable for a display, solid-state image sensor, and the like. A display and a solid-state image sensor incorporating the thin-film transistor according to the exemplary embodiment of the invention will be described below.

Initially, a display incorporating the thin-film transistor according to the exemplary embodiment of the invention will be described with reference to FIGS. 8A to 8C.

Figure 8A:
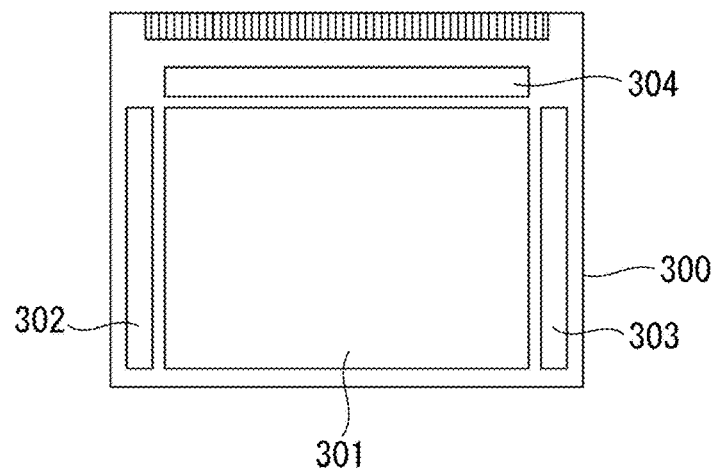
FIG. 8A is a top plan showing a display using the thin-film transistor according to the exemplary embodiment of the invention.

FIG. 8A is a top plan view of a display according to an exemplary embodiment of the invention. FIG. 8B is a circuit diagram showing a circuit of a pixel unit in a form of a liquid crystal device of the display according to the exemplary embodiment of the invention. FIG. 8C is a circuit diagram showing another circuit of a pixel unit in a form of an organic EL device of the display according to the exemplary embodiment of the invention.

The transistor in the pixel unit may be the thin-film transistor according to the exemplary embodiment of the invention. The thin-film transistor according to the exemplary embodiment of the invention is easily made into an n-channel type. Accordingly, a part of the drive circuit capable of being provided by an n-channel transistor is formed on the same substrate as the transistor of the pixel unit. A highly reliable display can be provided using the thin-film transistor of the exemplary embodiment for the pixel unit and/or the drive circuit.

FIG. 8A is a top plan view showing an example of an active matrix display. The display includes a substrate 300, and a pixel unit 301, a first scan line drive circuit 302, a second scan line drive circuit 303, and a signal line drive circuit 304 formed on the substrate 300. Multiple signal lines extend from the signal line drive circuit 304 to the pixel unit 301. Multiple scan lines extend from the first scan line drive circuit 302 and the second scan line drive circuit 303 to the pixel unit 301. Pixels each including a display element are provided in a matrix at intersections of the scan lines and the signal lines. The substrate 300 of the display is connected to a timing controller (controller, also referred to as a control IC) through a connector such as an FPC (Flexible Printed Circuit).

As shown in FIG. 8A, the first scan line drive circuit 302, the second scan line drive circuit 303, and the signal line drive circuit 304 are provided on the same substrate 300 as the pixel unit 301. Such an arrangement results in reduction in the number of external component (e.g. drive circuit) and, consequently, reduction in production cost. In addition, when the drive circuit is provided outside the substrate 300, the lines have to be extended and the connection between the lines increases. With the drive circuit being provided on the same substrate 300, the number of connections between the lines can be reduced, thereby improving the reliability and yield rate.

Figure 8B:
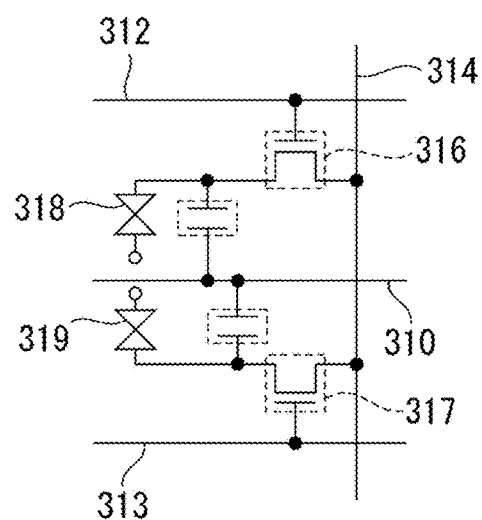
FIG. 8B illustrates a circuit of a pixel unit applicable to a pixel of a VA liquid crystal display.

An example of a pixel circuit is shown in FIG. 8B. FIG. 8B shows a circuit of a pixel unit applicable to a pixel unit of a VA liquid crystal display.

The circuit of the pixel unit is applicable to a device having a plurality of pixel electrodes in one pixel. The pixel electrodes are each connected to different transistors, whereby each of the transistors is drivable in accordance with a different gate signal. Thus, the signals to be applied to the respective pixel electrodes of a multi-domain structure can be independently controlled.

A gate line 312 of a transistor 316 and a gate line 313 of a transistor 317 are separated so that different gate signals are inputted thereto. In contrast, a source electrode or drain electrode 314 serving as a data line is common to the transistors 316 and 317. The transistors 316 and 317 may be the transistor according to the exemplary embodiment of the invention. A highly reliable liquid crystal display can be thereby provided.

First and second pixel electrodes are electrically connected to the transistors 316 and 317, respectively. The first pixel electrode is separated from the second pixel electrode. Shapes of the first and second pixel electrodes are not particularly limited. For instance, the first pixel electrode may be V-shaped.

Gate electrodes of the transistors 316 and 317 are connected with the gate lines 312 and 313, respectively. Different gate signals can be inputted to the gate lines 312 and 313 so that the transistors 316 and 317 are operated at different timings, thereby controlling orientation of the liquid crystal.

A capacity line 310, a gate insulating film serving as a dielectric, and a capacity electrode electrically connected with the first pixel electrode or the second pixel electrode may be provided to define a holding capacity.

In a multi-domain structure, first and second liquid crystal devices 318 and 319 are provided in one pixel. The first liquid crystal device 318 includes the first pixel electrode, an opposing electrode, and a liquid crystal layer interposed between the first pixel electrode and the opposing electrode. The second liquid crystal device 319 includes the second pixel electrode, an opposing electrode, and a liquid crystal layer interposed between the second pixel electrode and the opposing electrode.

The pixel unit is not necessarily arranged as shown in FIG. 8B. The pixel unit shown in FIG. 8B may additionally include a switch, a resistor, a capacitor, a transistor, a sensor, and/or a logic circuit.

Figure 8C:
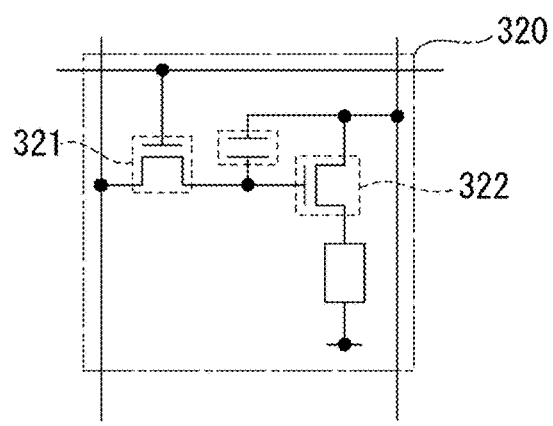
FIG. 8C illustrates a circuit of a pixel unit in a display using an organic EL device.

Another example of the pixel circuit is shown in FIG. 8C. Illustrated is a structure of a pixel unit in a display using an organic EL device.

FIG. 8C illustrates an applicable example of a circuit of a pixel unit 320. In this example, two n-channel transistors are used in one pixel. The oxide semiconductor film according to the exemplary embodiment of the invention is usable for a channel-formation region in the n-channel transistor. The circuit of the pixel unit can be driven in accordance with digital pulse width modulation control.

A switching transistor 321 and a drive transistor 322 may be the thin-film transistor according to the exemplary embodiment of the invention. A highly reliable organic EL display can be thereby provided.

The circuit of the pixel unit is not necessarily arranged as shown in FIG. 8C. The circuit of the pixel unit shown in FIG. 8C may additionally include a switch, a resistor, a capacitor, a sensor, a transistor, and/or a logic circuit.

The thin-film transistor according to the exemplary embodiment of the invention used in a display has been described above.

Next, a solid-state image sensor incorporating the thin-film transistor according to the exemplary embodiment of the invention will be described with reference to FIG. 9.

CMOS (Complementary Metal Oxide Semiconductor) image sensor is a solid-state image sensor including a signal charge accumulator for holding an electric potential, and an amplification transistor for transferring (outputting) the electric potential to a vertical output line. When the signal charge accumulator is charged or discharged by a possible leak current from the reset transistor and/or the transfer transistor of the CMOS image sensor, the electric potential of the signal charge accumulator changes. The change in the electric potential of the signal charge accumulator results in the change in the electric potential of the amplification transistor (i.e. shift from a desired value), deteriorating the quality of the captured image.

An effect of the thin-film transistor according to the exemplary embodiment of the invention incorporated in the reset transistor and transfer transistor of the CMOS image sensor will be described below. The amplification transistor may be any one of the thin-film transistor or a bulk transistor.

Figure 9:
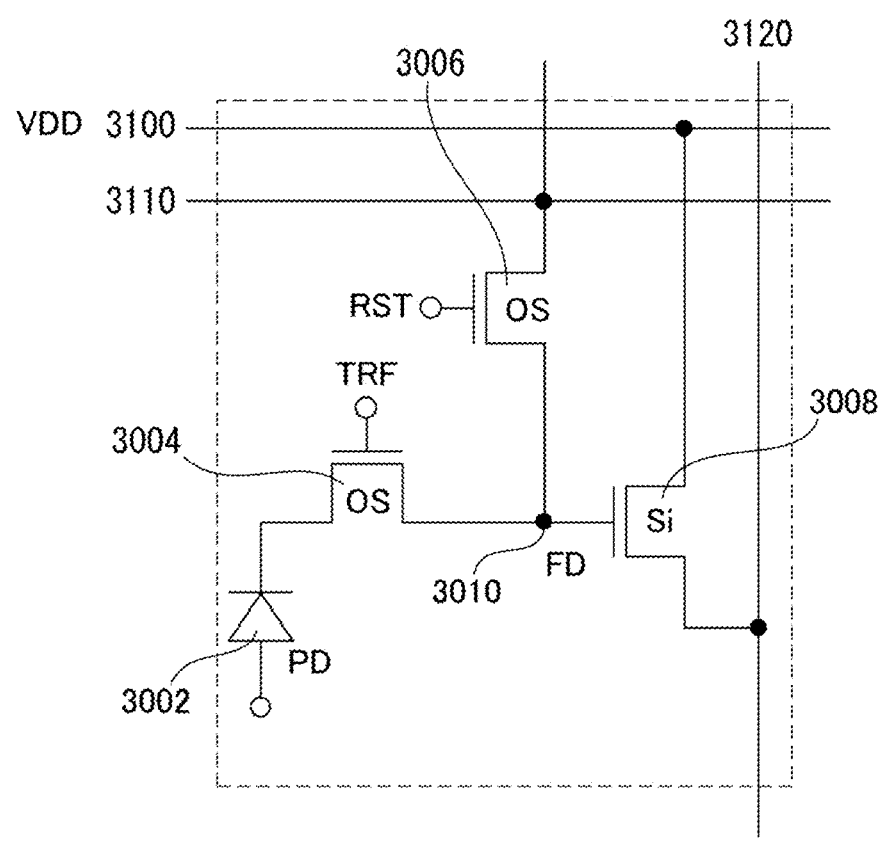
FIG. 9 illustrates a circuit of a pixel unit of a solid-state image sensor using a thin-film transistor according to an exemplary embodiment of the invention.

FIG. 9 illustrates an exemplary arrangement of the CMOS image sensor. The pixel includes a photodiode 3002 (photoelectric converter), a transfer transistor 3004, a reset transistor 3006, an amplification transistor 3008, and various lines. A plurality of the pixels are arranged in a matrix to form the sensor. A selector transistor may be electrically connected to the amplification transistor 3008. The characters in the transistor signs each represent a preferable material to be used for the transistors, where "OS" represents Oxide Semiconductor and "Si" represents silicon. The same applies to the other drawing(s).

The photodiode 3002 is connected to a source of the transfer transistor 3004. A signal charge accumulator 3010 (also referred to as FD (Floating Diffusion)) is provided to a drain of the transfer transistor 3004. The source of the reset transistor 3006 and the gate of the amplification transistor 3008 are connected to the signal charge accumulator 3010. A reset power line 3110 may be omitted in other embodiment. For instance, the drain of the reset transistor 3006 may be connected with a power line 3100 or a vertical output line 3120 instead of the reset power line 3110.

The oxide semiconductor film according to the exemplary embodiment of the invention, which may be made of the same material as the oxide semiconductor film used for the transfer transistor 3004 and the reset transistor 3006, may be used in the photodiode 3002.

The thin-film transistor according to the exemplary embodiment of the invention used in a solid-state image sensor has been described above.

EXAMPLES

The invention will be specifically described below with reference to Examples and Comparatives. It should however be noted that the scope of the invention is by no means limited by the Examples and Comparatives.

Preparation and Property Evaluation of Sintered Oxide

Example 1

Powders of gallium oxide, aluminum oxide, tin oxide, and indium oxide were weighed in a ratio (atomic ratio) as shown in Table 1, which were put in a polyethylene pot and mixed/pulverized using a dry ball mill for 72 hours to prepare mixture powder.

The mixture powder was put in a die and pressed at a pressure of 49 MPa (in terms of the SI unit equivalent to 500 kg/cm$^2$) to prepare a molding body. The molding body was compacted through CIP at a pressure of 196 MPa (in terms of the SI unit equivalent to 2000 kg/cm$^2$). Subsequently, after the molding body was put into an atmospheric-pressure sintering furnace and was held at 350 degrees C. for three hours, the temperature inside the furnace was raised at a temperature increase rate of 100 degrees C./hr., and the molding body was kept at 1480 degrees C. for 32 hours. Then, the molding body was left still to be cooled to obtain a sintered oxide.

Property Evaluation of Sintered Oxide

The following physical properties of the obtained sintered oxide were evaluated. The results are shown in Table 1.

(1) Crystalline Phase Observed by XRD

Figure 10:
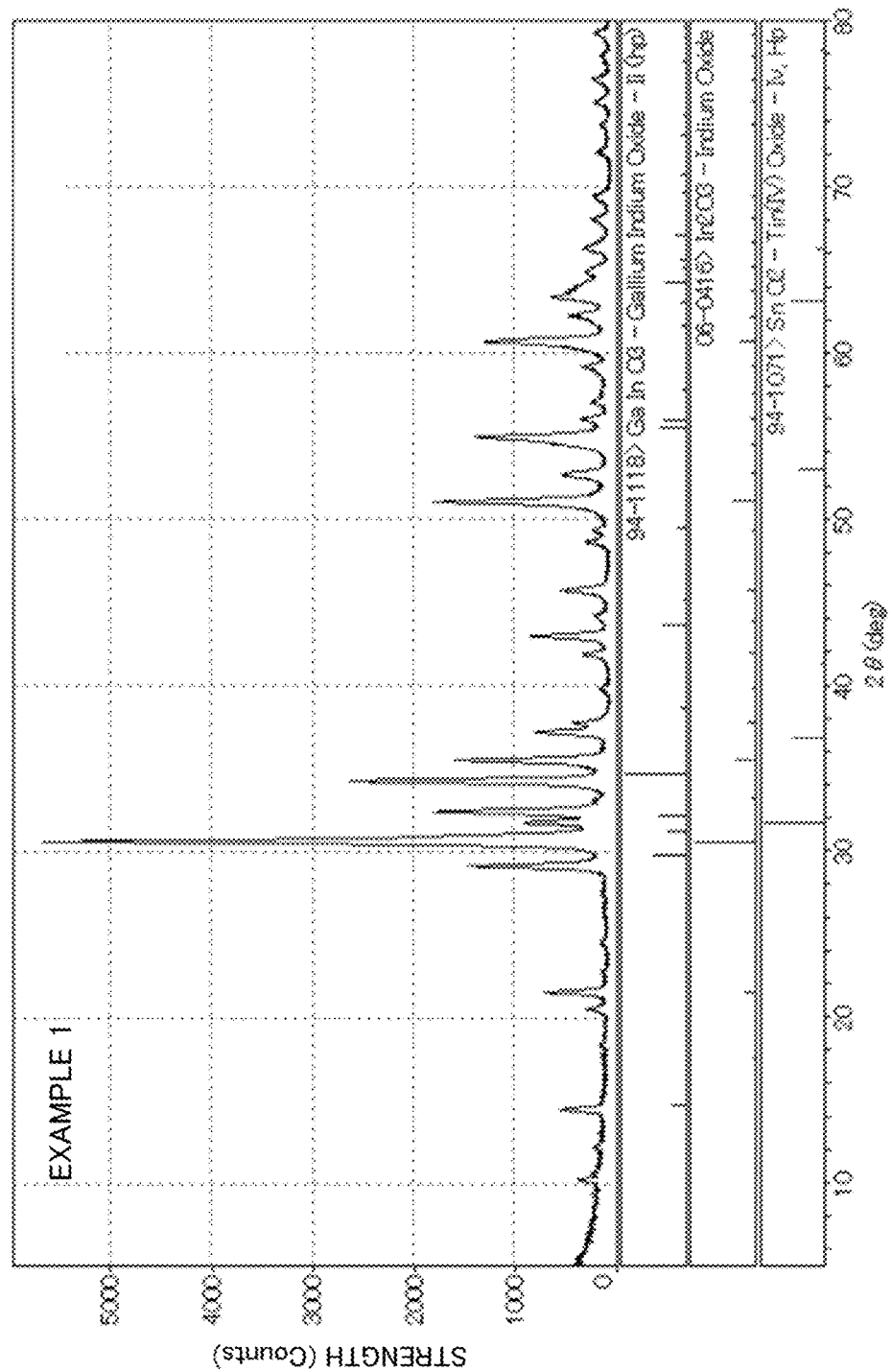
FIG. 10 is an XRD chart of a sintered body prepared in Example 1.
Figure 11:
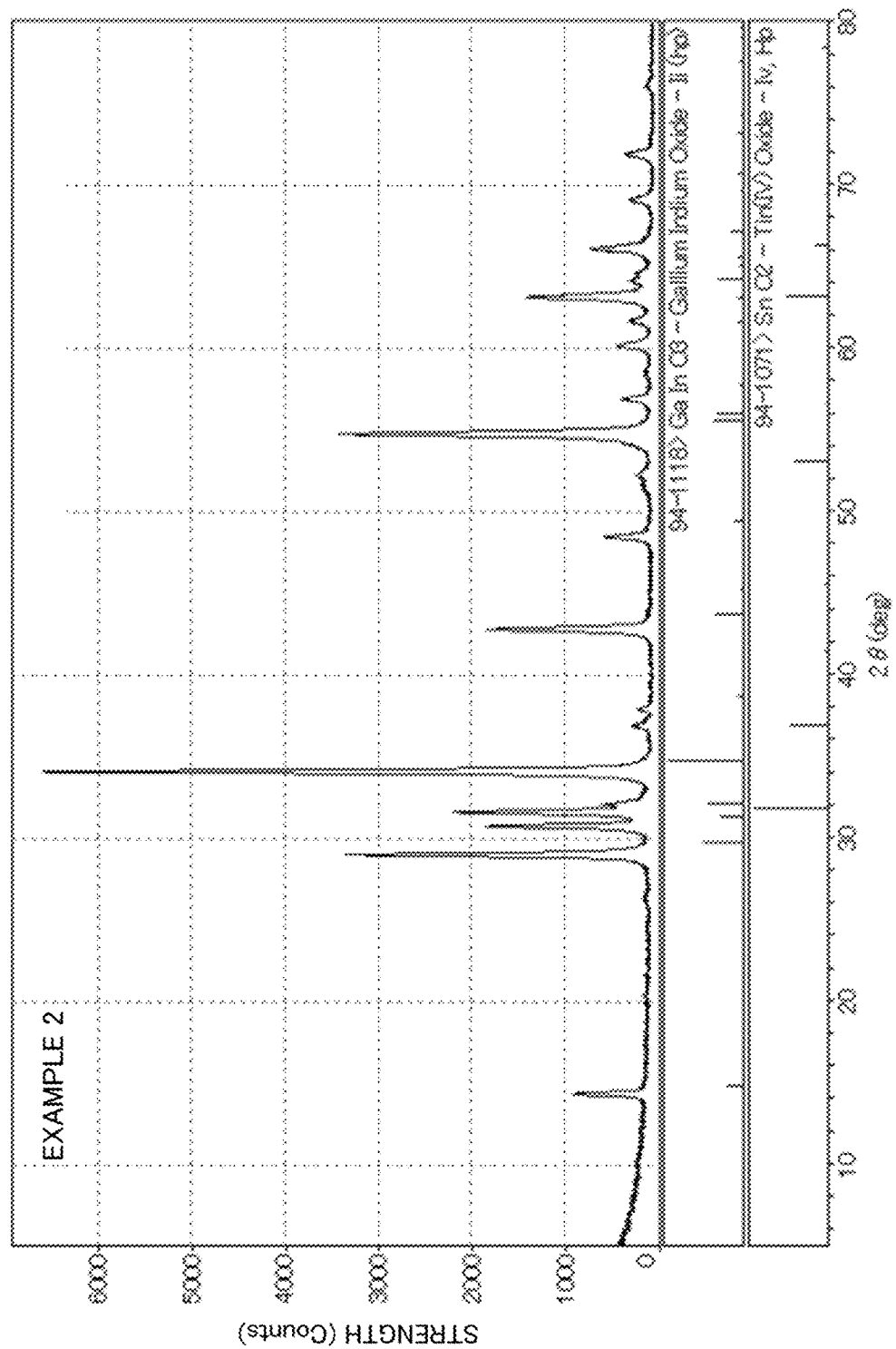
FIG. 11 is an XRD chart of a sintered body prepared in Example 2.
Figure 12:
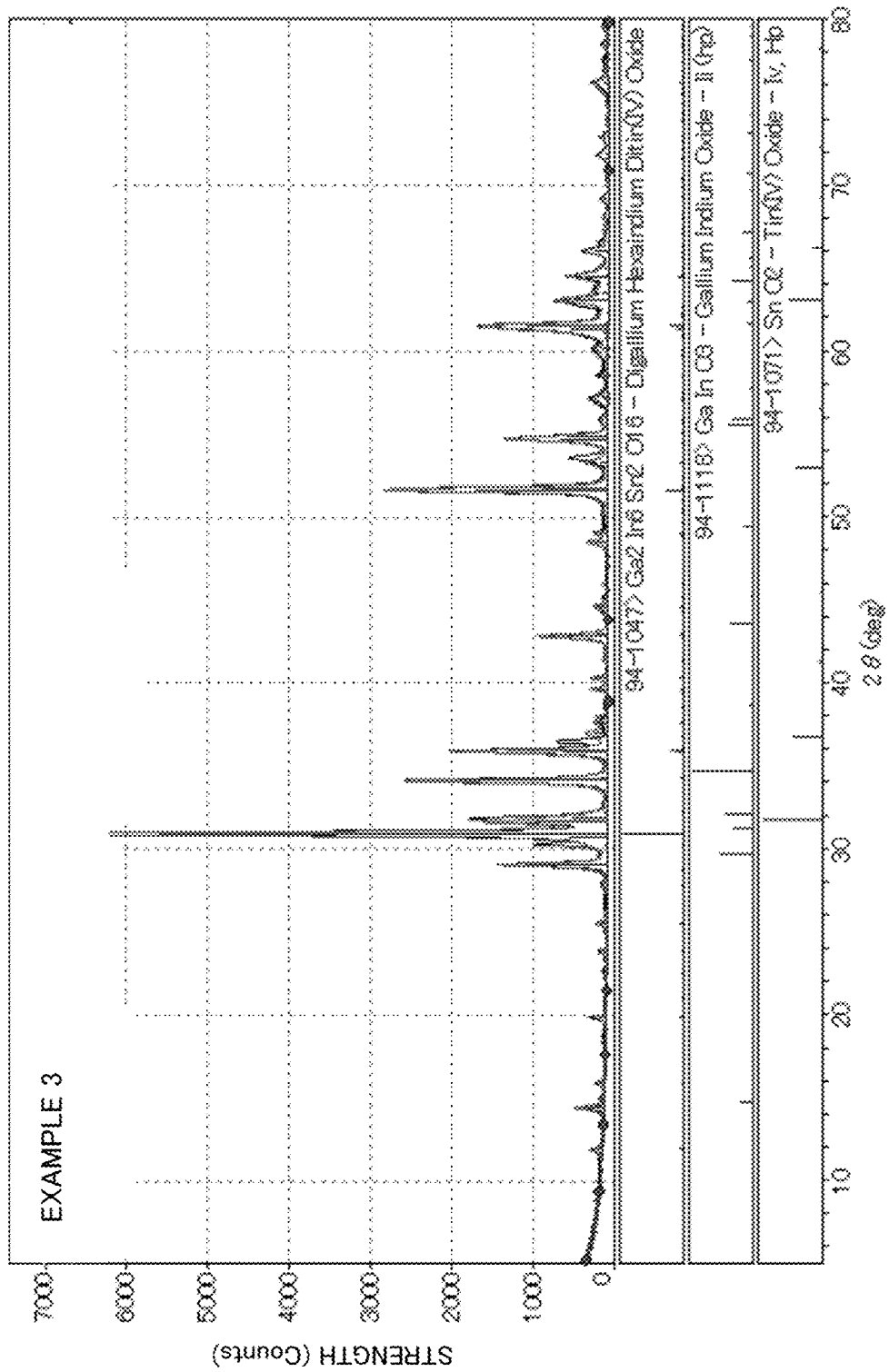
FIG. 12 is an XRD chart of a sintered body prepared in Example 3.
Figure 13:
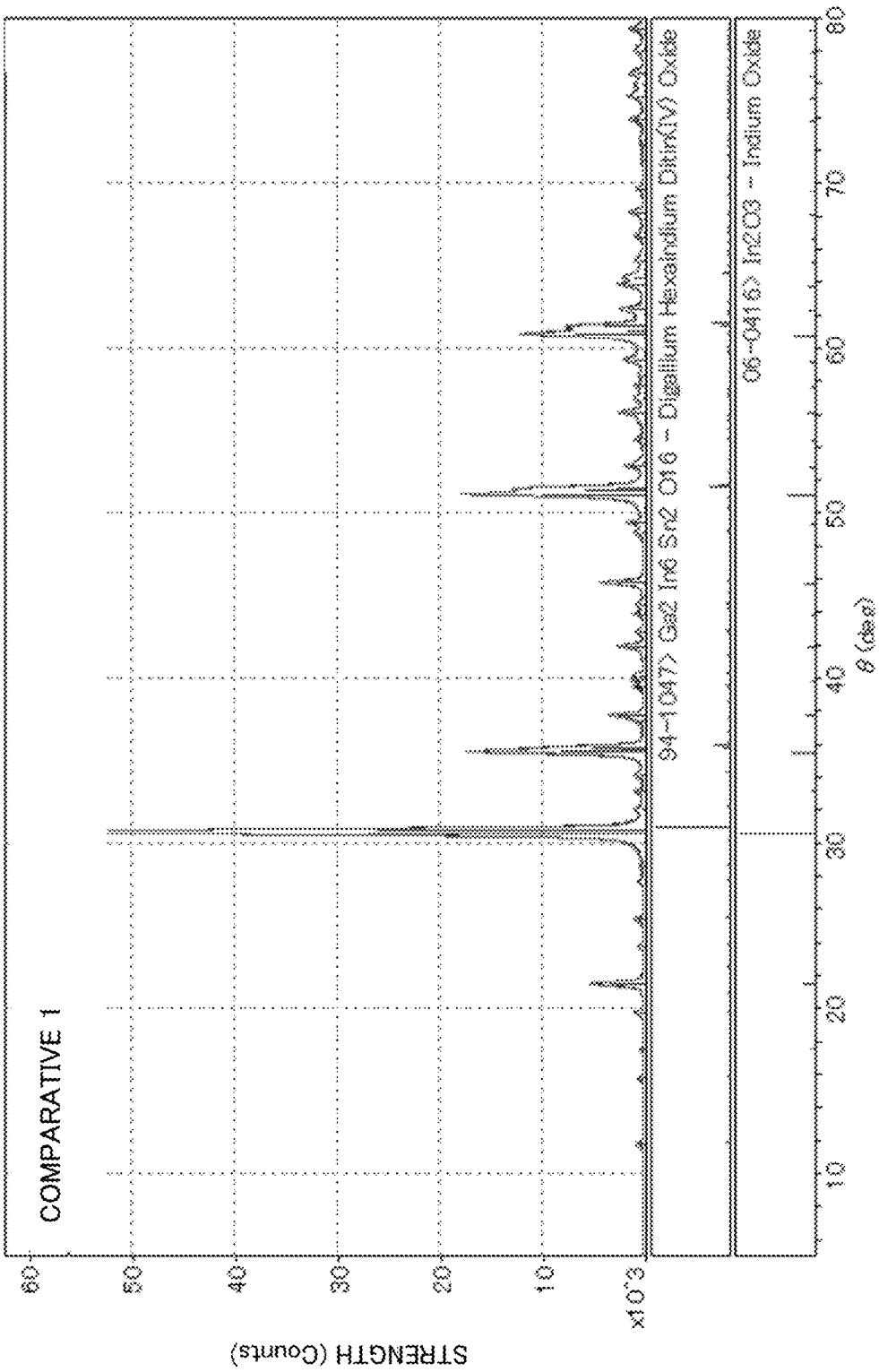
FIG. 13 is an XRD chart of a sintered body prepared in Comparative 1.
Figure 14:
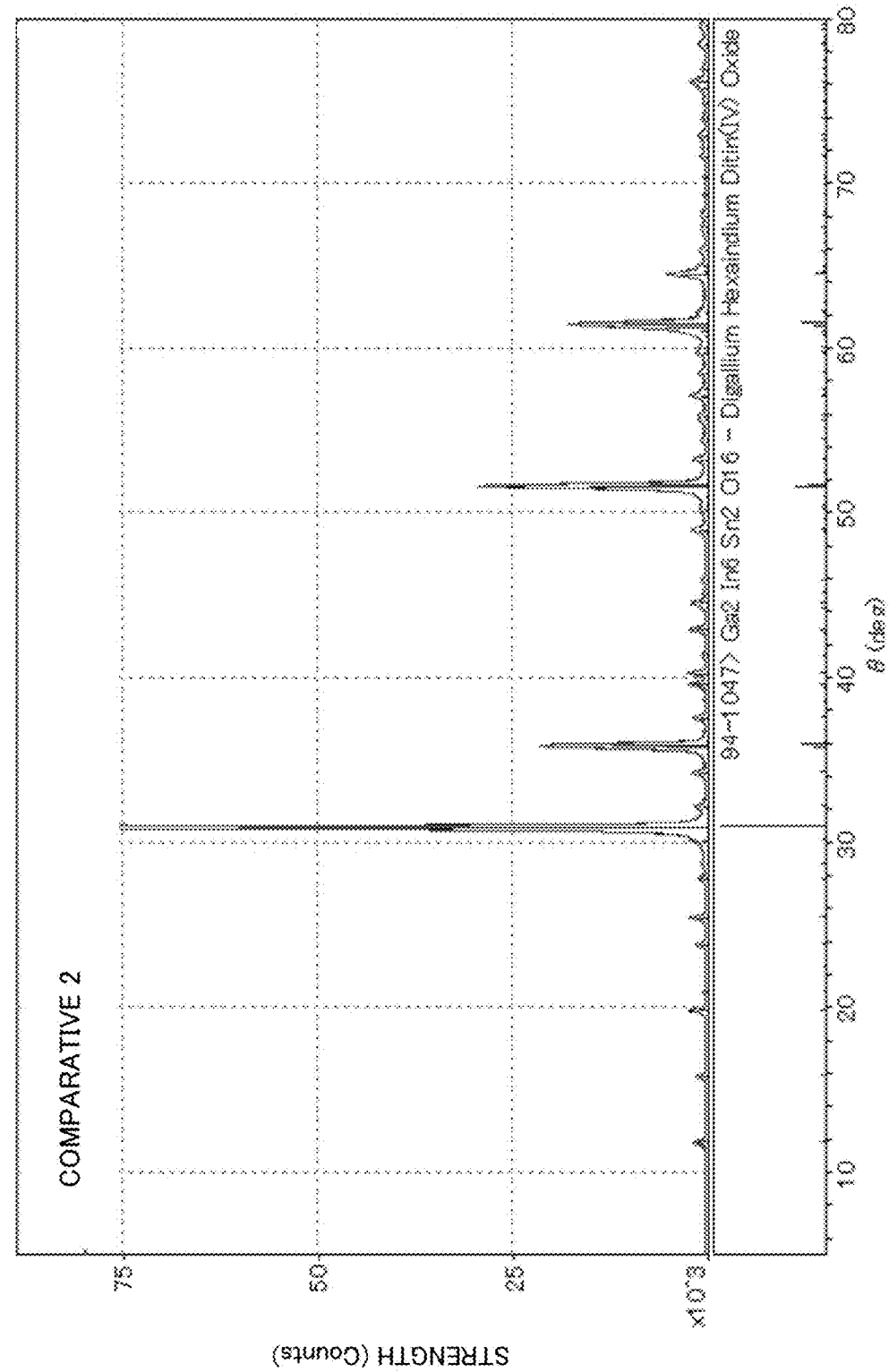
FIG. 14 is an XRD chart of a sintered body prepared in Comparative 2.
Figure 15:
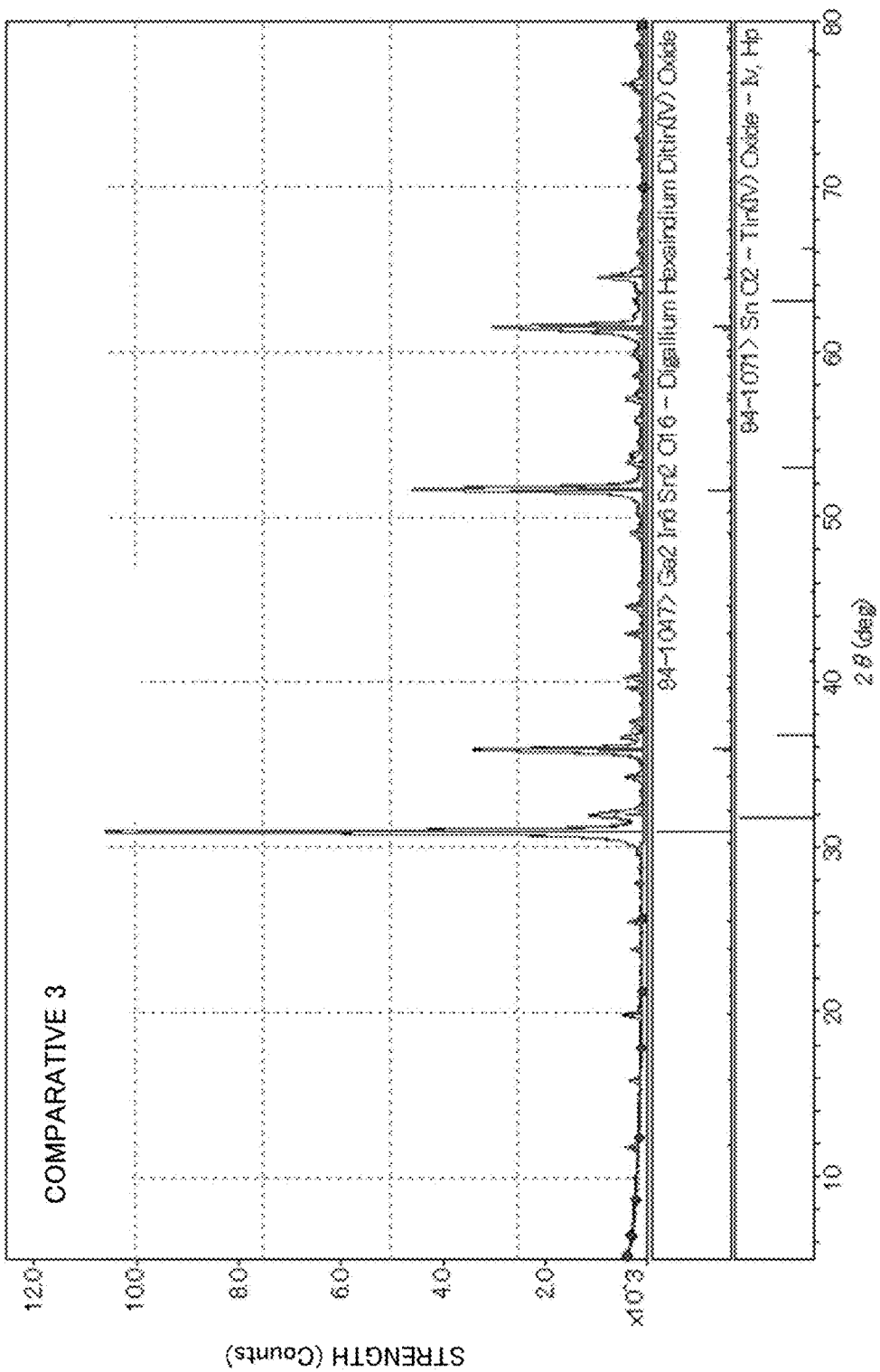
FIG. 15 is an XRD chart of a sintered body prepared in Comparative 3.

X-Ray Diffraction (XRD) of the obtained sintered body was measured using an X-ray diffractiometer Smartlab under the conditions below. The resultant XRD chart was analyzed using JADE6 to determine the crystalline phase in the sintered body. The resultant XRD chart is shown in FIG. 10.

Machine: Smartlab (manufactured by Rigaku Corporation)

X-ray: Cu—K α ray (wavelength 1.5418×10$^{-10}$ m)

2θ-θ Reflection method, Continuous Scan (2.0 degrees/min.)

Sampling interval: 0.02 degrees

Slit DS (Divergence Slit), SS (Scattering Slit), RS (Receiving Slit): 1 mm (2) Relative Density (%)

The "relative density" herein refers to a value represented by percentage obtained by dividing an actual density of the sintered oxide, which is measured by Archimedes method, by a theoretical density of the sintered oxide. In the invention, the theoretical density is calculated as follows.

Theoretical density=(total weight of material powder for the sintered oxide)/(total volume of the material powder of the sintered oxide)

For instance, when use amounts (charge amounts) of an oxide A, oxide B, oxide C, and oxide D, which are materials of the material powder of the sintered oxide, are represented by a (g), b (g), c (g), and d (g), respectively, the theoretical density can be calculated according to the formula below.

Theoretical density=$(a+b+c+d)/((a/\text{density of oxide } A)+(b/\text{density of oxide } B)+(c/\text{density of oxide } C)+(d/\text{density of oxide } D))$ It should be noted that the density of each of the oxides is substantially equal to the specific gravity of each of the oxides. Accordingly, the value of the specific gravity described in "Handbook of Chemistry: Pure Chemistry, Chemical Society of Japan, revised 2nd ed. (MARUZEN-YUSHODO Company, Limited) is used as the value of the density.

(3) Bulk Resistivity (mΩ·cm)

The bulk resistivity (mΩ·cm) of the obtained sintered body was measured according to a four-probe method (JIS R1637) using a resistivity meter Loresta (manufactured by Mitsubishi Chemical Corporation).

Five points (the center of the sintered oxide, and four middle points between four corners of the sintered oxide and the center of the sintered oxide) were measured and averaged to calculate the bulk resistivity.

(4) State of Target (Sintered Oxide) After Film-Formation at 400 W DC Power for 5 hrs.

A surface of the target was visually checked after film-formation at DC power 400 W for five hours.

Examples 2 and 3 and Comparatives 1 to 3

The material oxides of the compositions shown in Table 1 were subjected to the same process as in Example 1 to prepare sintered oxides. The obtained sintered oxides were evaluated in the same manner as in Example 1. The results are shown in Table 1. The resultant XRD charts are shown in FIGS. 11 to 15.

Comparatives 1, 2, which did not contain Al, and Comparative 3, whose Al content was lower than the lower limit defined by the formula (8), produced black foreign bodies and hairline cracks at the eroded portion after the film-formation for 5 hours at 400 W DC power. Further, the $Ga_2In_6Sn_2O_{16}$ compound, whose content was larger in Comparatives 1 to 3 than in Examples 1 to 3, was the main component in Comparatives 1 to 3.

Based on the above results, it is found that the sintered body, whose composition satisfies the formulae (5) to (8), restrains the generation of the $Ga_2In_6Sn_2O_{16}$ compound, and the generation of the foreign bodies and cracks at the time of sputtering.

Production and Performance Evaluation of Thin-Film Transistor

Example A

Preparation of Semiconductor Film

Figure 16A:
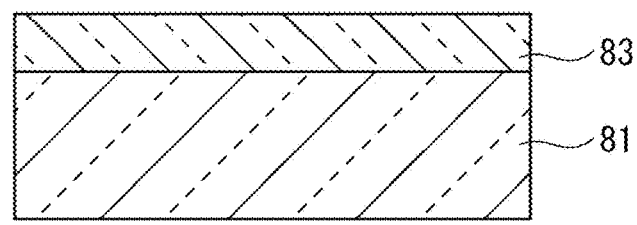
FIG. 16A is a vertical cross section showing an oxide semiconductor thin-film formed on a glass substrate.

Initially, as shown in FIG. 16A, samples each having only an oxide thin-film formed on a glass substrate were prepared and the properties of the samples were measured and evaluated, according to the following specific procedures.

Initially, with the use of sputtering targets made of the sintered oxides produced in Examples 1 to 4 and Comparatives 1 and 2, a 50-nm thin film (oxide semiconductor layer) was formed on a glass substrate through sputtering under the conditions shown in "production conditions" in Table 2. Sputtering gas in a form of mixture gas of high-purity argon and 1 volume % high-purity oxygen was used for the sputtering.

TABLE 1

|  | Example 1 | Example 2 | Example 3 | Comparative 1 | Comparative 2 | Comparative 3 |
|---|---|---|---|---|---|---|
| $Ga_2O_3/(In_2O_3 + Ga_2O_3 + SnO_2 + Al_2O_3)$ | 6.3 | 13.0 | 13.0 | 6.9 | 14.2 | 13.0 |
| $SnO_2/(In_2O_3 + Ga_2O_3 + SnO_2 + Al_2O_3)$ | 10.2 | 21.0 | 21.00 | 11.1 | 22.8 | 21.0 |
| $In_2O_3/(In_2O_3 + Ga_2O_3 + SnO_2 + Al_2O_3)$ | 75.5 | 58.0 | 62.00 | 82.0 | 63.0 | 64.5 |
| $Al_2O_3/(In_2O_3 + Ga_2O_3 + SnO_2 + Al_2O_3)$ | 8.0 | 8.0 | 4.00 | — | — | 1.5 |
| Ga/(In + Ga + Sn) | 0.099 | 0.200 | 0.192 | 0.10 | 0.20 | 0.187 |
| Sn/(In + Ga + Sn) | 0.100 | 0.200 | 0.192 | 0.10 | 0.20 | 0.188 |
| In/(In + Ga + Sn) | 0.801 | 0.600 | 0.616 | 0.80 | 0.60 | 0.625 |
| Al/(In + Ga + Sn + Al) | 0.188 | 0.157 | 0.098 | — | — | 0.038 |
| Crystalline Phase Observed by XRD (mass %) | $In_2O_3$ (59.1%) $GaInO_3$ (33.4%) $SnO_2$ (7.5%) | $InGaO_3$ (98.1%) $SnO_2$ (1.9%) — | $Ga_2In_6Sn_2O_{16}$ (37.7%) $GaInO_3$ (55.2%) $SnO_2$ (7.1%) | $Ga_2In_6Sn_2O_{16}$ (92.7%) $Sn_2O_3$ (7.3%) — | $Ga_2In_6Sn_2O_{16}$ (≈100%) — — | $Ga_2In_6Sn_2O_{16}$ (92.7%) $SnO_2$ (7.3%) — |
| Relative Density [%] | 99.0 | 99.6 | 99.3 | 95.7 | 97.9 | 97.3 |
| Bulk Resistivity [mΩ · cm] | 4.52 | 16.5 | 14.5 | 0.96 | 4.45 | 5.3 |
| State of Target after Film-Formation at 400 W DC Power for 5 hrs. | No significant change except for erosion | No significant change except for erosion | No significant change except for erosion | Black foreign body and hairline cracks occurred in eroded portion | Black foreign body and hairline cracks occurred in eroded portion | Black foreign body and hairline cracks occurred in eroded portion |

As shown in Table 1, Examples 1 to 3, whose compositions satisfy the formulae (5) to (8), did not exhibit significant change except for the formation of erosion even after the film-formation for 5 hours at 400 W DC power.

Then, after the obtained sample was subjected to a heat treatment in atmospheric air at 350 degrees C. for 30 minutes, the properties of the treated thin-film were evaluated. Specific evaluation items and method are as follows.

Measurement of Hall Effect

The Hall-effect measurement sample was set to a Hall-effect/specific resistance measurement system (ResiTest 8300, manufactured by TOYO Corporation) to evaluate the Hall effect and determine the carrier density and carrier mobility at a room temperature.

Crystal Property of Semiconductor Film

Crystallinity of a non-heated film after sputtering (immediately after film deposition) and crystallinity of the film immediately after being heated were evaluated through X-Ray Diffraction (XRD) measurement.

Lattice Constant ($10^{-10}$ m) of $In_2O_3$ Crystal

The lattice constant was calculated through lattice-constant refinement starting from JCPDS card $In_2O_3$ (PDF#06-0416) using JADE6 based on the crystal peak obtained through XRD.

Band Gap of Semiconductor Film

Transmission spectrum of a thin-film sample formed on a quartz substrate and subjected to the same heat treatment as in the semiconductor film was measured, whose results were plotted in a graph (abscissa axis: wavelength, ordinate axis: transmittance). Then, after the wavelength in abscissa axis was converted into energy (eV) and the transmittance in ordinate axis was converted into:

$$(\alpha h \nu)^2$$

where
  α: absorption coefficient,
  h: Planck's constant, and
  ν: oscillation frequency,
a straight line was fitted to a rising portion of the absorption and an eV value at an intersection of the straight line with a base line was calculated.

The results are shown in "semiconductor film" "after heat treatment" in Table 2.

Figure 16B:
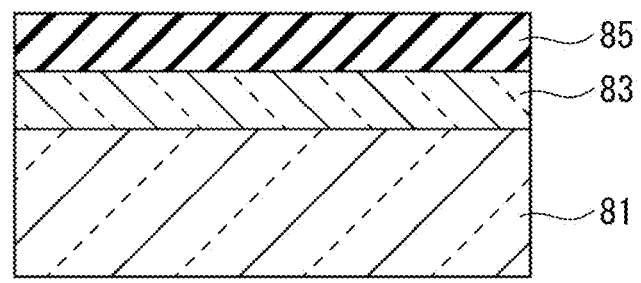
FIG. 16B illustrates an $SiO_2$ film formed on the oxide semiconductor thin-film shown in FIG. 16A.

An $SiO_2$ film (protective insulation film; interlayer insulating film) was formed on a semiconductor film having been subjected to a heat treatment using chemical vapor deposition (CVD) at a substrate temperature of 300 degrees C. to prepare a sample shown in FIG. 16B. The carrier density and carrier mobility in the formed thin-film were evaluated under the same conditions as in "(1) Measurement of Hall Effect." The results are shown in "semiconductor film" "after $SiO_2$ film is formed" in Table 2.

The sample, on which the $SiO_2$ film was formed, was subjected to a heat treatment (subsequent annealing) at 350 degrees C. for 0.5 or 1 hour. The carrier density and carrier mobility of the sample after being subjected to the heat treatment were evaluated under the same conditions as in "immediately after $SiO_2$ formation." The results are shown in "semiconductor film" "after $SiO_2$ film formation+heat treatment" in Table 2.

Production of Thin-Film Transistor

Next, a TFT (Thin-Film Transistor) having an oxide thin-film was prepared and performance of the produced TFT was measured and evaluated. Specific procedures are as follows.

(1) Film-Formation Step

A 50-nm thin film (oxide semiconductor layer) was formed on a silicon wafer (gate electrode) coated with a thermally oxidized film (gate insulating film) via a metal mask through a sputtering process using a sputtering target produced from the sintered oxide prepared in Example 1. Sputtering gas in a form of mixture gas of high-purity argon and 1% high-purity oxygen was used for sputtering.

(2) Formation of Source/Drain Electrodes

Titanium metal was sputtered through a metal mask to form source/drain electrodes. Then, the resultant layered body was subjected to a heat treatment at 350 degrees C. for an hour. TFT performance of the produced thin-film transistor (TFT) was evaluated.

Specific evaluation items and conditions are as follows.

Saturation Mobility ($cm^2$/V·sec)

The saturation mobility was determined based on a transfer function when 5 V drain voltage was applied. Specifically, the saturation mobility was calculated by: plotting a graph of a transfer function Id-Vg; calculating transconductance (Gm) for each Vg; and calculating the saturation mobility using a formula in a linear region. It should be noted that Gm is represented by $\partial(Id)/\partial(Vg)$, and the saturation mobility is defined by a maximum carrier mobility in a Vg range from −15 to 25 V. The saturation mobility herein is evaluated according to the above unless otherwise specified. In the above, Id represents a current between source and drain electrodes, and Vg represents a gate voltage when the voltage Vd is applied between the source and drain electrodes.

Threshold Voltage (Vth)

The threshold voltage (Vth) is defined as Vg at $Id=10^{-9}$ A based on the graph of the transfer function. The results are shown in Table 2.

Off-Current Value and On/Off Ratio

The On/Off ratio is determined as a ratio [On/Off] of On current value (a value of Id when Vg=20 V) to Off current value (a value of Id when Vg=−10 V). The results are shown in Table 2.

The results are shown in "TFT" "after heat treatment and before $SiO_2$ film formation" in Table 2.

(3) Formation of Protective Insulation Film

An $SiO_2$ film (protective insulation film; interlayer insulating film) was formed on a semiconductor film having been subjected to a heat treatment using chemical vapor deposition (CVD) at a substrate temperature of 300 degrees C., which was subsequently subjected to a further heat treatment (subsequent annealing) at 350 degrees C. for 30 minutes.

The performance of the TFT having been subjected to the heat treatment after forming the $SiO_2$ film was evaluated under the same conditions as in the "after heat treatment and before $SiO_2$ film formation." The results are shown in "TFT" "after $SiO_2$ film formation+heat treatment" in Table 2.

Examples B and C and Comparative A

The thin-film transistor was produced and evaluated in the same manner as in Example A except that the used sputtering target was prepared from the sintered oxide produced by Examples (Comparative) shown in Table 2 and the films were produced under conditions shown in Table 2. The results are shown in Table 2.

TABLE 2

| | | | Example A | Example B | Example C | Comparative A |
|---|---|---|---|---|---|---|
| Semiconductor Film | film-formation conditions of semiconductor film | used sputtering target atmosphere gas | Example 1 Ar + $O_2$ | Example 2 Ar + $O_2$ | Example 3 Ar + $O_2$ | Comparative 1 Ar + $O_2$ |

TABLE 2-continued

|  |  |  | Example A | Example B | Example C | Comparative A |
|---|---|---|---|---|---|---|
|  |  | back-pressure before film-formation (Pa) | $5.0 \times 10^{-4}$ | $5.0 \times 10^{-4}$ | $5.0 \times 10^{-4}$ | $5.0 \times 10^{-4}$ |
|  |  | sputtering pressure in film-formation (Pa) | 0.5 | 0.5 | 0.5 | 0.5 |
|  |  | substrate temperature in film-formation (° C.) | room temperature | room temperature | room temperature | room temperature |
|  |  | oxygen partial pressure in film-formation (%) | 1 | 1 | 1 | 1 |
|  | heat treatment conditions after forming semiconductor film | heat treatment after film-formation: temperature (° C.) | 350 | 350 | 350 | 350 |
|  |  | : temperature increase rate (° C./min.) | 10 | 10 | 10 | 10 |
|  |  | : time (min.) | 60 | 60 | 60 | 30 |
|  |  | : atmosphere | atmospheric air | atmospheric air | atmospheric air | atmospheric air |
|  | after heat treatment | Film thickness (nm) | 50 | 50 | 50 | 50 |
|  |  | Hall measurement carrier density ($cm^{-3}$) | $1.9 \times 10^{17}$ | $1.5 \times 10^{14}$ | $6.1 \times 10^{17}$ | $3.6 \times 10^{19}$ |
|  |  | Hall measurement mobility ($cm^2/V \cdot sec$) | 9.33 | 6.89 | 15.7 | 24.3 |
|  |  | crystallinity immediately after film deposition (XRD) | amorphous | amorphous | amorphous | amorphous |
|  |  | crystallinity immediately after heating (XRD) | amorphous | amorphous | amorphous | amorphous |
|  |  | band gap of semiconductor film (eV) | 3.4 | 3.67 | 3.5 | 3.58 |
|  | after $SiO_2$ film is formed | Substrate temperature ° C. | 300 | 300 | 300 | 300 |
|  |  | Hall measurement carrier density ($cm^{-3}$) | $8.7 \times 10^{19}$ | $7.8 \times 10^{18}$ | $7.3 \times 10^{19}$ | $1.9 \times 10^{20}$ |
|  |  | Hall measurement mobility ($cm^2/V \cdot sec$) | 18.7 | 8.8 | 34.0 | 26.2 |
|  | after $SiO_2$ film formation + heat treatment | heat treatment: temperature (° C.) | 350 | 350 | 350 | 350 |
|  |  | : time (min.) | 30 | 30 | 60 | 30 |
|  |  | : atmosphere | atmospheric air | atmospheric air | atmospheric air | atmospheric air |
|  |  | Hall measurement carrier density ($cm^{-3}$) | $1.4 \times 10^{17}$ | $7.3 \times 10^{16}$ | $4.4 \times 10^{17}$ | $7.0 \times 10^{19}$ |
|  |  | Hall measurement mobility ($cm^2/V \cdot sec$) | 9.21 | 9.8 | 12.3 | 25.1 |
| TFT | after heat treatment and before $SiO_2$ film formation | saturation mobility ($cm^2/V \cdot sec$) | 11.1 | 8.7 | 14.1 | conductive |
|  |  | Vth (V) | 1.1 | 1.3 | −0.3 | — |
|  |  | on/off ratio | $>10^8$ | $>10^8$ | $>10^7$ | — |
|  |  | off current (A) | $<10^{-12}$ | $<10^{-12}$ | $<10^{-11}$ | — |
|  | after SiO2 film formation + heat treatment | saturation mobility ($cm^2/V \cdot sec$) | 18.9 | 13.1 | 25.5 | conductive |
|  |  | Vth (V) | −0.4 | 0.57 | −0.3 | — |
|  |  | on/off ratio | $>10^7$ | $>10^7$ | $>10^7$ | — |
|  |  | off current (A) | $<10^{-11}$ | $<10^{-11}$ | $<10^{-11}$ | — |

As shown in Table 2, Examples A to C, whose semiconductor films were formed using the sintered bodies of Examples 1 to 3, respectively, exhibited TFT performance after the heat treatment.

The semiconductor film of Comparative A, which was formed using the sintered body of Comparative 1, became conductive when heated, failing to exhibit the performance of TFT.

The invention claimed is:

1. An oxide semiconductor film comprising In, Ga, Sn and Al at respective atomic ratios satisfying formulae (1) to (4) below, $$0.01 \leq Ga/(In+Ga+Sn) \leq 0.30 \quad (1),$$

$$0.01 \leq Sn/(In+Ga+Sn) \leq 0.40 \quad (2),$$

$$0.55 \leq In/(In+Ga+Sn) \leq 0.98 \quad (3), \text{ and}$$

$$0.05 \leq Al/(In+Ga+Sn+Al) \leq 0.30 \quad (4),$$

wherein In, Ga, Sn and Al are the only metal elements in the film.

2. A thin-film transistor comprising the oxide semiconductor film according to claim 1.

3. A sintered oxide comprising In, Ga, Sn and Al at respective atomic ratios satisfying formulae (5) to (8) below, $$0.01 \leq Ga/(In+Ga+Sn) \leq 0.30 \quad (5),$$

$$0.01 \leq Sn/(In+Ga+Sn) \leq 0.40 \quad (6), \text{ and}$$

$$0.55 \leq In/(In+Ga+Sn) \leq 0.98 \quad (7),$$

$$0.05 \leq Al/(In+Ga+Sn+Al) \leq 0.30 \quad (8)$$

wherein In, Ga, Sn and Al are the only metal elements in the sintered oxide.

4. The sintered oxide according to claim 3, wherein the sintered oxide comprises a main component in a form of $In_2O_3$ crystals, and one or both of $InGaO_3$ crystals and $SnO_2$ crystals.

5. The sintered oxide according to claim 3, wherein the sintered oxide does not to contain one or both of $Ga_3InSn_5O_{16}$ compound and $Ga_2In_6Sn_2O_{16}$ compound as a main component.

6. The sintered oxide according to claim 3, wherein a relative density of the sintered oxide is 95% or more.

7. The sintered oxide according to claim 3, wherein a bulk resistivity of the sintered oxide is 20 mΩcm or less.

8. A sputtering target comprising: the sintered oxide according to claim 3; and a backing plate.

9. A production method of the sintered oxide according to claim 3, the method comprising:
    mixing material compound powders comprising In, Ga, and Sn to prepare a mixture;
    molding the mixture to prepare a molding body; and
    sintering the molding body.

10. An electronic device comprising the thin-film transistor according to claim 2.

11. The sintered oxide according to claim 4, wherein the sintered oxide does not to contain one or both of $Ga_3InSn_5O_{16}$ compound and $Ga_2In_6Sn_2O_{16}$ compound as a main component.

12. The oxide semiconductor film according to claim 1, wherein the oxide semiconductor film is amorphous.

13. The oxide semiconductor film according to claim 1, wherein
    In, Ga and Sn at respective atomic ratios satisfy formulae (1A) to (3A) below, $$0.02 \leq Ga/(In+Ga+Sn) \leq 0.27 \quad (1A),$$

$$0.02 \leq Sn/(In+Ga+Sn) \leq 0.35 \quad (2A), \text{ and}$$

$$0.60 \leq In/(In+Ga+Sn) \leq 0.96 \quad (3A), \text{ and}$$

Al at an atomic ratio satisfies the formula (4) below, $$0.05 \leq Al/(In+Ga+Sn+Al) \leq 0.30 \quad (4).$$

14. The oxide semiconductor film according to claim 1, wherein In, Ga and Sn at respective atomic ratios satisfy formulae (1B) to (3B) below, $$0.03 \leq Ga/(In+Ga+Sn) \leq 0.23 \quad (1B),$$

$$0.03 \leq Sn/(In+Ga+Sn) \leq 0.30 \quad (2B), \text{ and}$$

$$0.60 \leq In/(In+Ga+Sn) \leq 0.94 \quad (3B), \text{ and}$$

Al at an atomic ratio satisfies the formula (4B) below, $$0.08 \leq Al/(In+Ga+Sn+Al) \leq 0.22 \quad (4B).$$

15. The sintered oxide according to claim 3, wherein In, Ga and Sn at respective atomic ratios satisfy formulae (5A) to (7A) below, $$0.02 \leq Ga/(In+Ga+Sn) \leq 0.27 \quad (5A),$$

$$0.02 \leq Sn/(In+Ga+Sn) \leq 0.35 \quad (6A), \text{ and}$$

$$0.60 \leq In/(In+Ga+Sn) \leq 0.96 \quad (7A), \text{ and}$$

Al at an atomic ratio satisfies the formula (8) below, $$0.05 \leq Al/(In+Ga+Sn+Al) \leq 0.30 \quad (8).$$

16. The sintered oxide according to claim 3, wherein In, Ga and Sn at respective atomic ratios satisfy formulae (5B) to (7B) below, $$0.03 \leq Ga/(In+Ga+Sn) \leq 0.23 \quad (5B),$$

$$0.03 \leq Sn/(In+Ga+Sn) \leq 0.30 \quad (6B), \text{ and}$$

$$0.60 \leq In/(In+Ga+Sn) \leq 0.94 \quad (7B), \text{ and}$$

Al at an atomic ratio satisfies the formula (8B) below, $$0.08 \leq Al/(In+Ga+Sn+Al) \leq 0.22 \quad (8B).$$

* * * * *